(12) United States Patent
Yu et al.

(10) Patent No.: US 10,249,640 B2
(45) Date of Patent: Apr. 2, 2019

(54) WITHIN-ARRAY THROUGH-MEMORY-LEVEL VIA STRUCTURES AND METHOD OF MAKING THEREOF

(71) Applicant: SANDISK TECHNOLOGIES LLC, Plano, TX (US)

(72) Inventors: Jixin Yu, Milpitas, CA (US); Zhenyu Lu, Milpitas, CA (US); Alexander Chu, Milpitas, CA (US); Kensuke Yamaguchi, Yokkaichi (JP); Hiroyuki Ogawa, Yokkaichi (JP); Daxin Mao, Cupertino, CA (US); Yan LI, Milpitas, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/176,674

(22) Filed: Jun. 8, 2016

(65) Prior Publication Data
US 2017/0358593 A1 Dec. 14, 2017

(51) Int. Cl.
*H01L 27/11582* (2017.01)
*H01L 27/11573* (2017.01)
(Continued)

(52) U.S. Cl.
CPC .... *H01L 27/11582* (2013.01); *H01L 23/5226* (2013.01); *H01L 23/5283* (2013.01);
(Continued)

(58) Field of Classification Search
CPC combination set(s) only.
See application file for complete search history.

(56) References Cited

U.S. PATENT DOCUMENTS

| 5,915,167 A | 6/1999 | Leedy |
| 9,224,747 B2 | 12/2015 | Mizutani et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Tucker J Wright
*Assistant Examiner* — Wilner Jean Baptiste
(74) *Attorney, Agent, or Firm* — The Marbury Law Group PLLC

(57) ABSTRACT

A semiconductor structure includes a memory-level assembly located over a substrate and including at least one alternating stack and memory stack structures vertically extending through the at least one alternating stack. Each of the at least one an alternating stack includes alternating layers of respective insulating layers and respective electrically conductive layers, and each of the electrically conductive layers in the at least one alternating stack includes a respective opening such that a periphery of a respective spacer dielectric portion located in the opening contacts a sidewall of the respective electrically conductive layers. At least one through-memory-level via structure vertically extends through each of the spacer dielectric portions and the insulating layers.

27 Claims, 36 Drawing Sheets

(51) Int. Cl.
*H01L 23/522* (2006.01)
*H01L 23/528* (2006.01)
*H01L 27/11565* (2017.01)
*H01L 27/1157* (2017.01)
*H01L 27/11575* (2017.01)

(52) U.S. Cl.
CPC .... *H01L 27/1157* (2013.01); *H01L 27/11565* (2013.01); *H01L 27/11573* (2013.01); *H01L 27/11575* (2013.01)

(56) References Cited

U.S. PATENT DOCUMENTS

| | | | |
|---|---|---|---|
| 9,236,392 B1 | 1/2016 | Izumi et al. | |
| 9,356,034 B1 | 5/2016 | Yada et al. | |
| 2012/0061744 A1* | 3/2012 | Hwang | H01L 27/11565 257/324 |
| 2012/0208347 A1* | 8/2012 | Hwang | H01L 27/1157 438/430 |
| 2013/0126957 A1* | 5/2013 | Higashitani | H01L 27/11519 257/314 |
| 2015/0214103 A1* | 7/2015 | Matsuda | H01L 27/11575 257/314 |
| 2016/0027730 A1 | 1/2016 | Lee | |
| 2016/0064821 A1 | 3/2016 | Nakano et al. | |
| 2016/0071876 A1 | 3/2016 | Mizuno et al. | |
| 2016/0111434 A1 | 4/2016 | Pachamuthu et al. | |
| 2017/0017118 A1* | 1/2017 | Yonemoto | G02B 5/3016 |

OTHER PUBLICATIONS

U.S. Appl. No. 14/291,415, filed May 30, 2014, SanDisk 3D LLC.
U.S. Appl. No. 14/739,284, filed Jun. 15, 2015, SanDisk Technologies LLC.
U.S. Appl. No. 14/739,354, filed Jun. 15, 2015, SanDisk Technologies LLC.
U.S. Appl. No. 15/043,761, filed Feb. 15, 2016, SanDisk Technologies LLC.
U.S. Appl. No. 15/046,780, filed Feb. 18, 2016, SanDisk Technologies LLC.
U.S. Appl. No. 15/175,450, filed Jun. 7, 2016, SanDisk Technologies LLC.
International Search Report and Written Opinion of the International Searching Authority for International Patent Application No. PCT/US2017/019132, dated May 30, 2017, 15 pages.
International Preliminary Report on Patentability and Written Opinion of the International Searching Authority for International Patent Application No. PCT/US2017/019132, dated Dec. 20m 2018, 9 pages.

* cited by examiner

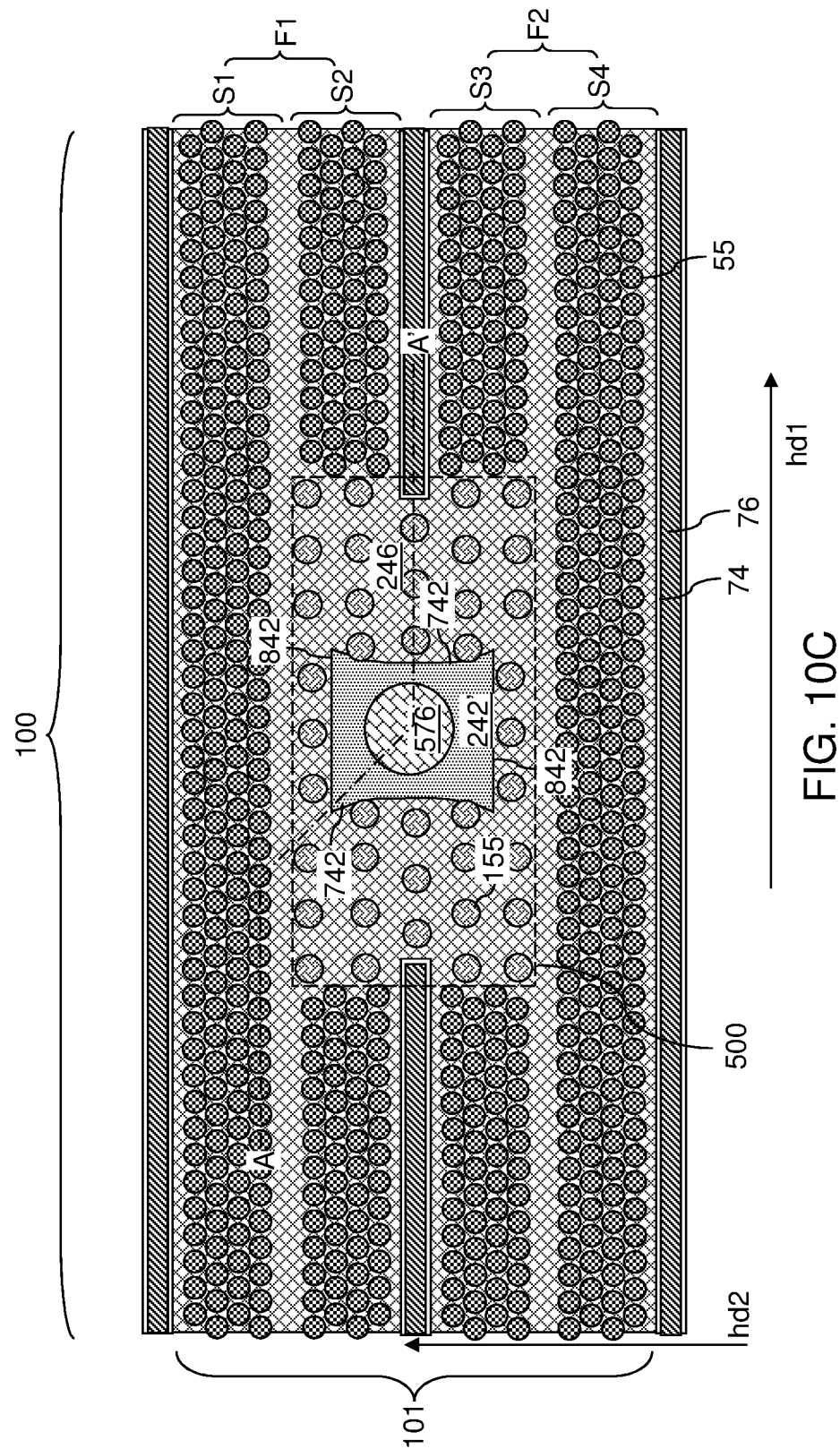

WITHIN-ARRAY THROUGH-MEMORY-LEVEL VIA STRUCTURES AND METHOD OF MAKING THEREOF

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer dielectric layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

As three-dimensional memory devices scale to smaller device dimensions, the device area for peripheral devices can take up a significant portion of the total chip area. Thus, a method of providing various peripheral devices, such as word line driver circuits, without significantly increasing the total chip size is desired. Further, an efficient power distribution network in the array of memory stack structures can increase performance of three-dimensional memory devices. A method of enhancing power distribution without excessively increasing the footprint of a semiconductor chip is also desired.

SUMMARY

According to an aspect of the present disclosure, a semiconductor structure is provided, which comprises: a memory-level assembly located over a substrate and including at least one alternating stack and memory stack structures vertically extending through the at least one alternating stack, wherein each of the at least one an alternating stack includes alternating layers of respective insulating layers and respective electrically conductive layers, and each of the electrically conductive layers in the at least one alternating stack includes a respective opening such that a periphery of a respective spacer dielectric portion located in the opening contacts a sidewall of the respective electrically conductive layers, and at least one through-memory-level via structure that vertically extends through each of the spacer dielectric portions and the insulating layers.

According to another aspect of the present disclosure, a method of forming a semiconductor structure is provided. At least one alternating stack and memory stack structures vertically extending through the at least one alternating stack are formed over a substrate. Each of the at least one an alternating stack includes alternating layers of respective insulating layers and respective sacrificial material layers including a dielectric material having a different composition than the respective insulating layers. Lateral recesses are formed by laterally removing portions of the sacrificial material layers selective to the insulating layers. Remaining portions of the sacrificial material layers within the at least one alternating stack constitute spacer dielectric portions. At least one through-memory-level via structure is formed through each of the spacer dielectric portions and each of the insulating layers within the at least one alternating stack. In one embodiment, the at least one through-memory-level via structure vertically extends at least from a first horizontal plane including a topmost surface of the memory-level assembly to a second horizontal plane including a bottommost surface of the memory-level assembly.

BRIEF DESCRIPTION OF THE DRAWINGS

FIG. 10C is a horizontal cross-sectional view of the exemplary structure along the horizontal plane C-C' in FIG. 10A. The zig-zag vertical plane A-A' corresponds to the plane of the vertical cross-sectional view of FIG. 10A.

DETAILED DESCRIPTION

Figure 1:
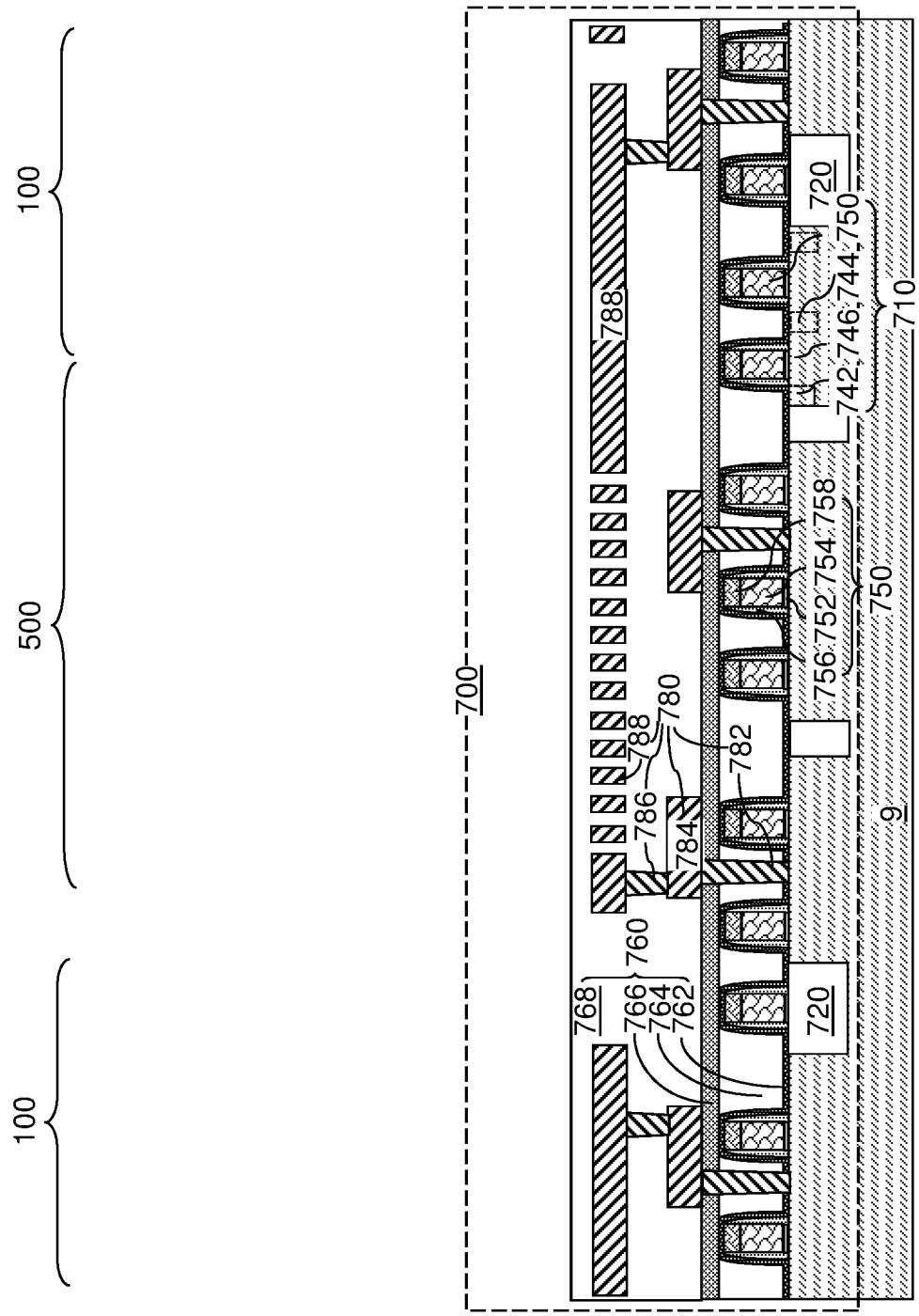
FIG. 1 is a vertical cross-sectional view of an exemplary structure after formation of semiconductor devices, at least one lower level dielectric layer, and lower level metal interconnect structures on a semiconductor substrate according to an embodiment of the present disclosure.

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIG. 1, an exemplary structure according to an embodiment of the present disclosure is illustrated. The exemplary structure includes a semiconductor substrate 9, and semiconductor devices 710 formed thereupon. Shallow trench isolation structures 720 can be formed in an upper portion of the semiconductor substrate 9 to provide electrical isolation among the semiconductor devices 710. The semiconductor devices 710 can include, for example, field effect transistors including respective source regions 742, drain regions 744, channel regions 746 and gate structures 750. The field effect transistors may be arranged in a CMOS configuration. Each gate structure 750 can include, for example, a gate dielectric 752, a gate electrode 754, a gate cap dielectric 758, and a dielectric gate spacer 756. The semiconductor devices can include any semiconductor circuitry to support operation of a memory structure to be subsequently formed, which is typically referred to as driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 760. The at least one lower level dielectric layer 760 can include, for example, an optional dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed. The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices and the combination of the at least one lower level dielectric layer 760 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760.

The lower level metal interconnect structures 780 can be electrically shorted to nodes (e.g., source 742, drain 744 or gate electrodes 750) of the semiconductor devices 710 (e.g., CMOS devices), and are located at the level of the at least one lower level dielectric layer 760. The through-memory-level via structures (not shown in FIG. 1) can be subsequently formed directly on the lower level metal interconnect structures 780. In one embodiment, the pattern of the lower level metal interconnect structures 780 can be selected such that the lower level topmost metal structures 788, which are a subset of the lower level metal interconnect structures 780 located at the topmost portion of the lower level metal interconnect structures 780, can provide landing pad structures within a through-memory-level via region 500. The through-memory-level via region 500 is a region in which through-memory-level via structures that extend vertically through a memory-level assembly are subsequently formed.

In one embodiment, the through-memory-level via region 500 can be entirely surrounded by a memory array region 100 in which memory stack structures (not shown) are subsequently formed). A word line contact via region (not shown) can be located adjacent to the through-memory-level via region 500 and the memory array region 100. In one embodiment, the through-memory-level via region 500 can be located within a group (which is referred to as a "block") of memory stack structures that share a same set of electrically conductive layers as word lines.

While a particular pattern for the lower level topmost metal structures 788 is illustrated herein, it is understood that the pattern for the lower level topmost metal structures 788 may be altered to optimize wiring in the underlying peripheral device region 700 as long as the lower level topmost metal structures 788 provide suitable landing pad areas for the through-memory-level via structures to be subsequently formed.

Figure 2A:
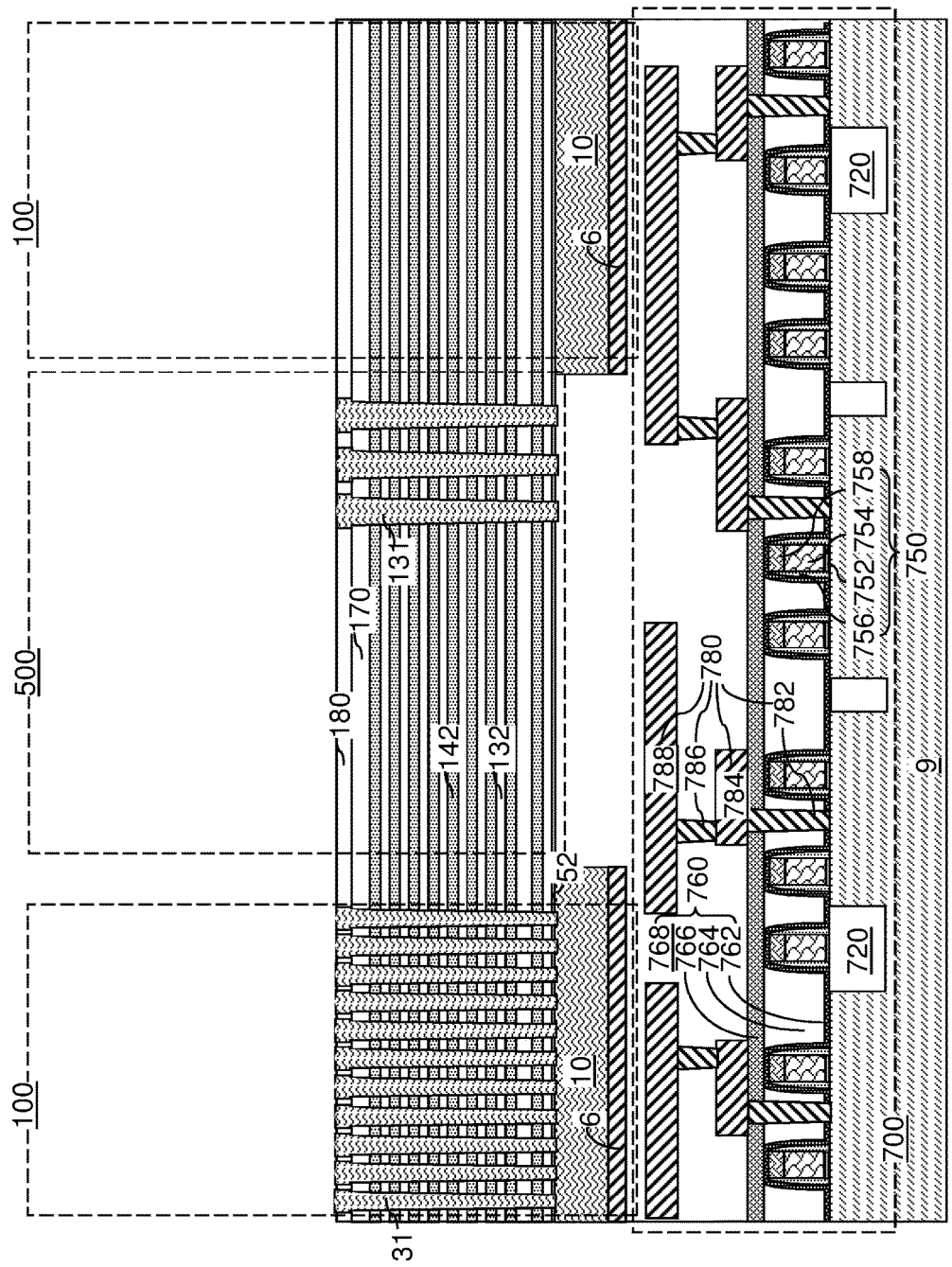
FIG. 2A is a vertical cross-sectional view of the exemplary structure after formation of a planar semiconductor material layer, a first-tier alternating stack of first insulting layers and first spacer dielectric layers, first-tier memory openings and first-tier support openings, and first-tier sacrificial opening fill portions according to an embodiment of the present disclosure.
Figure 2B:
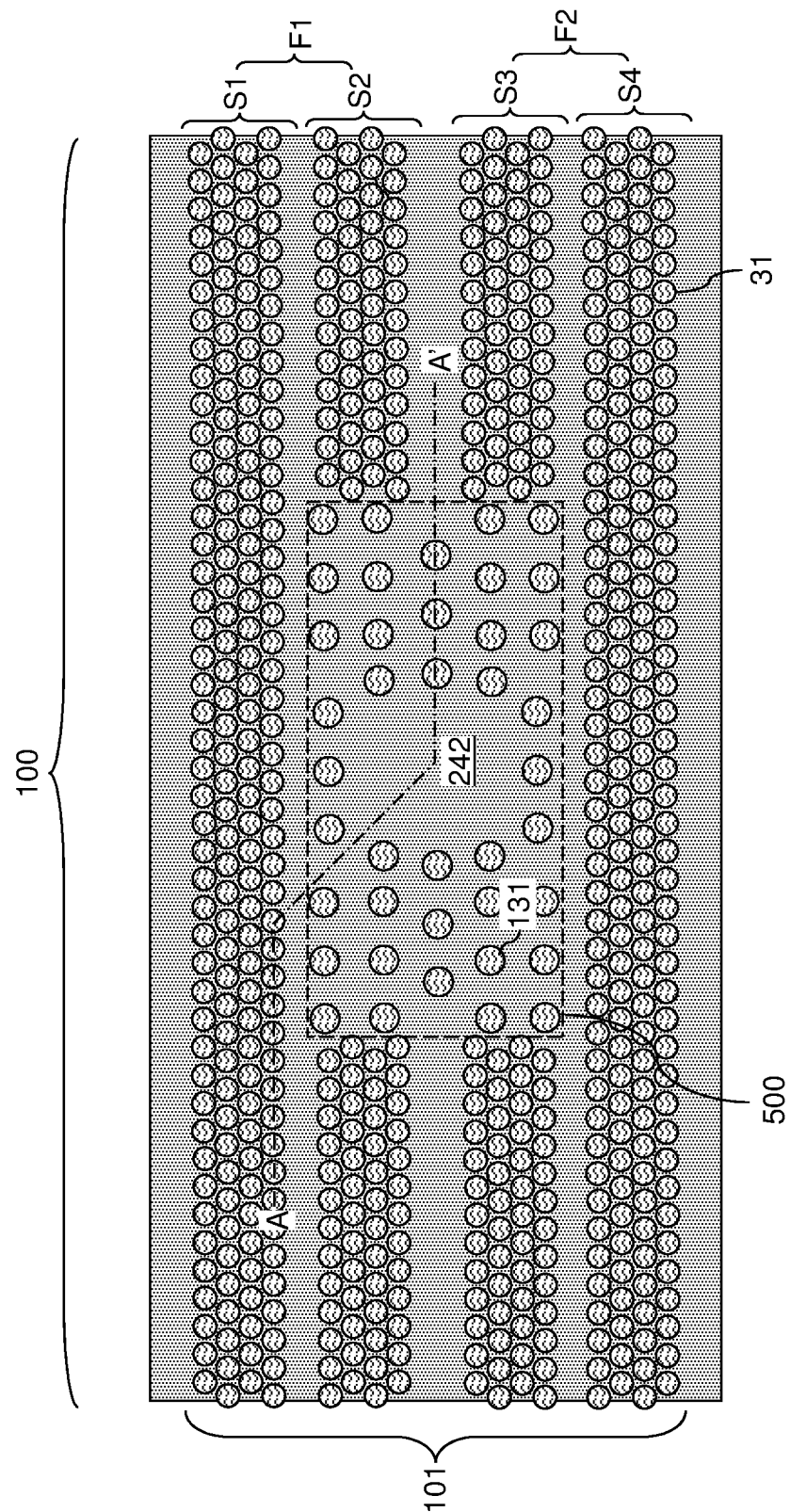
FIG. 2B is a horizontal cross-sectional view of the exemplary structure along the horizontal plane B-B' in FIG. 2A. The zig-zag vertical plane A-A' corresponds to the plane of the vertical cross-sectional view of FIG. 2A.

Referring to FIGS. 2A and 2B, an optional planar conductive material layer 6 and a planar semiconductor material layer 10 can be formed over the underlying peripheral device region 700. In one embodiment, an upper portion of the at least one lower level dielectric layer 760 may be recessed in the memory array region 100, and the optional planar conductive material layer 6 and the planar semiconductor material layer 10 may be formed in the recessed region of the at least one lower level dielectric layer 760. In another embodiment, the optional planar conductive material layer 6 and the planar semiconductor material layer 10 may be deposited as planar material layers over the at least one lower level dielectric layer 760, and the portion of the optional planar conductive material layer 6 and the planar semiconductor material layer 10 may be removed from the through-memory-level via region 500. The opening in the optional planar conductive material layer 6 and the planar semiconductor material layer 10 within the area of the through-memory-level via region 500 can be filled with a dielectric material (such as undoped silicate glass or doped silicate glass), which can be added to, and incorporated into, the at least one lower level dielectric layer 760.

The optional planar conductive material layer 6 includes a conductive material such as a metal, a metal-semiconductor alloy (such as a metal silicide), or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can be formed over the at least one lower level dielectric layer 760.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 9 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type. A dielectric pad layer 52 can be formed on the top surface of the planar semiconductor material layer 10.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer dielectric layers as the second material layers. In one embodiment, the first spacer dielectric layers can be sacrificial material layers that are subsequently replaced with electrically conductive layers. In one embodiment, the first sacrificial material layers can include a dielectric material having a different composition than the first insulating layers 132. For example, the first insulating layers 132 can include silicon oxide, and the first sacrificial material layers can include silicon nitride.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

In one embodiment, an opening can be formed through the first insulating cap layer 170 within a staircase region, which is a region in which stepped terraces are subsequently formed. Within the staircase region, the first-tier alternating stack (132, 142) can be patterned to form first stepped surfaces in each word line contact via region (not shown). Each word line contact via regions can include a respective first stepped area in which the first stepped surfaces are formed, and a second stepped area in which additional stepped surfaces are to be subsequently formed in a second tier structure (to be subsequently formed over a first tier structure) and/or additional tier structures. The first stepped surfaces can be formed, for example, by forming a mask layer with an opening therein within the area of the opening through the first insulating cap layer 170, etching a cavity through a topmost first sacrificial material layer and a topmost insulating layer by transferring the pattern of the opening in the mask layer, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion (not shown). As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion collectively constitute a first tier structure, which is an in-process structure that is subsequently modified.

Optionally, an inter-tier dielectric layer 180 may be deposited over the first tier structure (132, 142, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed.

Openings can be formed through the optional inter-tier dielectric layer 180 and the first tier structure (132, 142, 170). The openings can include first-tier memory openings that are formed in the memory array region 100, and first-tier support openings that are formed in the through-memory-level via region 500. The first-tier memory openings extend to a top surface of the planar semiconductor material layer 10. The first-tier support openings can extend onto, and optionally into, the at least one lower level dielectric layer 760.

The first-tier memory openings can be formed in the memory array region 100 at locations at which memory stack structures including vertical stacks of memory elements are to be subsequently formed, and the first-tier support openings can be formed in the through-memory-stack via region 500. For example, a lithographic material stack (not shown) including at least a photoresist layer can be formed over the inter-tier dielectric layer 180, and can be lithographically patterned to form openings within the lithographic material stack. The pattern in the lithographic material stack can be transferred through the inter-tier dielectric layer 180, the first insulating cap layer 170, and through the entirety of the first-tier alternating stack (132, 142) by at least one anisotropic etch that employs the patterned lithographic material stack as an etch mask. Portions of the inter-tier dielectric layer 180, the first insulating cap layer 170, and the first-tier alternating stack (132, 142) underlying the openings in the patterned lithographic material stack are etched to form the first-tier memory openings and the first-tier support openings. In other words, the transfer of the pattern in the patterned lithographic material stack through the first insulating cap layer 170 and the first-tier alternating stack (132, 142) forms the first-tier memory openings and the first-tier support openings.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches. The sidewalls of the first-tier memory openings can be substantially vertical, or can be tapered. Subsequently, the patterned lithographic material stack can be subsequently removed, for example, by ashing.

Optionally, the portions of the first-tier memory openings at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. In this case, the widened portions of the first-tier memory openings and the first-tier support openings at the level of the inter-tier dielectric layer 180 may be employed to provide a larger landing pad for second-tier memory openings and second via openings to be subsequently formed through a second-tier alternating stack (which is formed over the inter-tier dielectric layer prior to formation of the second-tier memory openings).

A sacrificial fill material can be deposited in each of the first-tier memory openings and the first-tier support openings. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In one embodiment, the sacrificial fill material layer can include amorphous silicon or a carbon-containing material (such as amorphous carbon or diamond-like carbon) that can be subsequently removed by ashing. Portions of the deposited sacrificial material can be removed from above the inter-tier dielectric layer 180. For example, the sacrificial fill material layer can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer. Each remaining portion of the sacrificial material in a first-tier memory opening constitutes a sacrificial memory opening fill portion 31. Each remaining portion of the sacrificial material in a first-tier support opening constitutes a sacrificial via fill portion 131. The top surfaces of the sacrificial memory opening fill portions 31 and the sacrificial via fill portions 131 can be coplanar with the top surface of the inter-tier dielectric layer 180. The sacrificial memory opening fill portion 31 and/or the sacrificial via fill portions 131 may, or may not, include cavities therein.

As will be described in more detail below, FIG. 2B illustrates a memory block 101 which includes a first finger F1 and a second finger F2 that extend along the first horizontal direction and adjacent to each other along a second horizontal direction that is perpendicular to the first horizontal direction. Each finger (F1, F2) can be divided into a pair of strips, such as a pair of a first strip S1 and a second strip S2, or a pair of a third strip S3 and a fourth strip S4.

Figure 3:
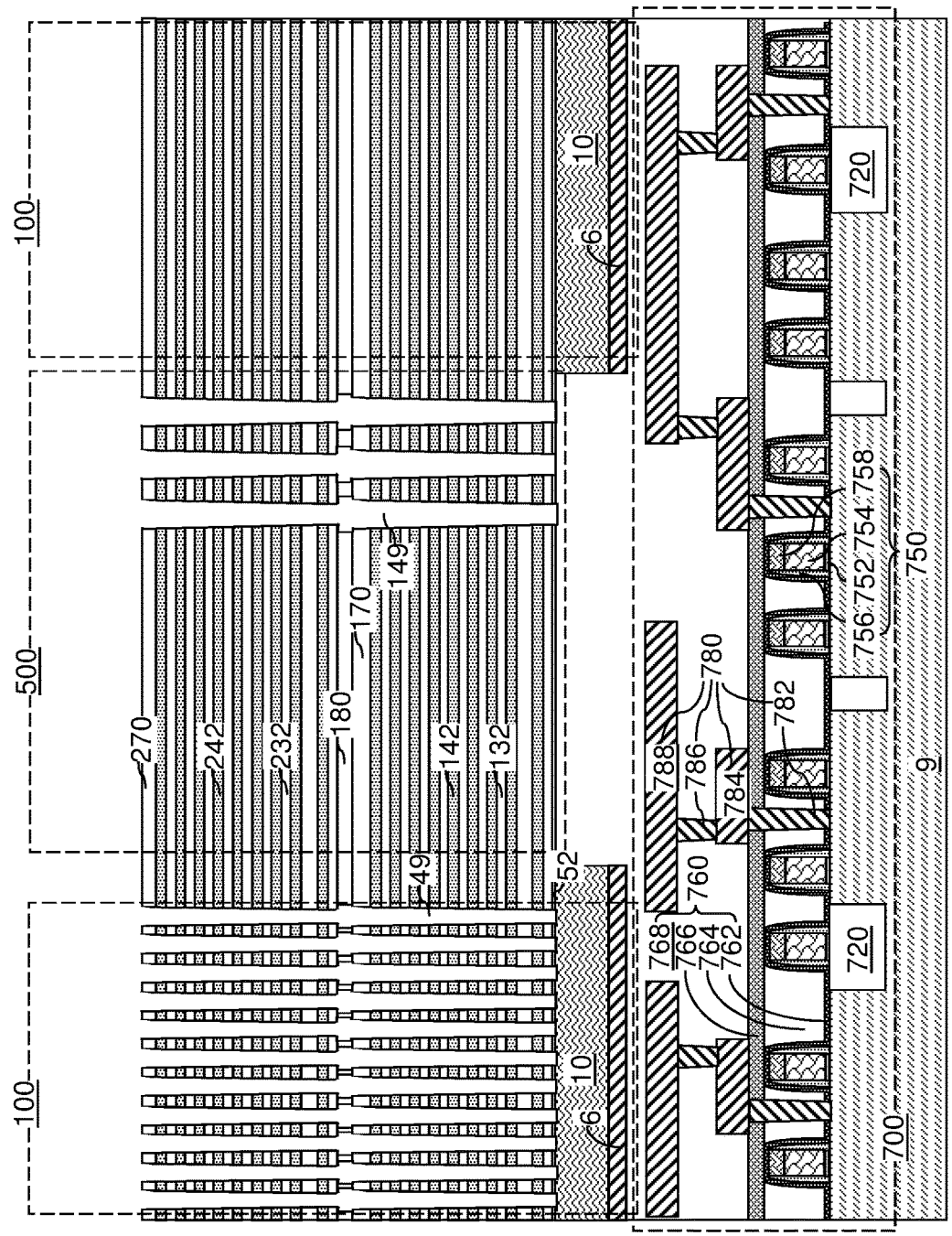
FIG. 3 is a vertical cross-sectional view of the exemplary structure after formation of a second-tier alternating stack of second insulating layers and second spacer dielectric layers, second-tier memory openings and second-tier support openings, and removal of the first-tier sacrificial opening fill portions according to an embodiment of the present disclosure.

Referring to FIG. 3, a second tier structure can be formed over the first tier structure (132, 142, 170, 31, 131). The second tier structure can include an additional alternating stack of insulating layers and spacer dielectric layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer dielectric layers that provide vertical spacing between each vertically neighboring pair of the second insulating layers 232. In one embodiment, the third material layers and the fourth material layers can be second insulating layers 232 and second sacrificial material layers 242, respectively. The second sacrificial material layers 242 can include a dielectric material having a different composition than the second insulating layers 232. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces (not shown) in the second stepped area can be formed in the through-memory-level via regions and the word line contact via regions employing a same set of processing steps as the processing steps employed to form the first stepped surfaces in the first stepped area with suitable adjustment to the pattern of at least one masking layer. A second-tier retro-stepped dielectric material portion (not shown) can be formed over the second stepped surfaces in the through-memory-level via regions 500 and the word line contact via regions.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Figure 11A:
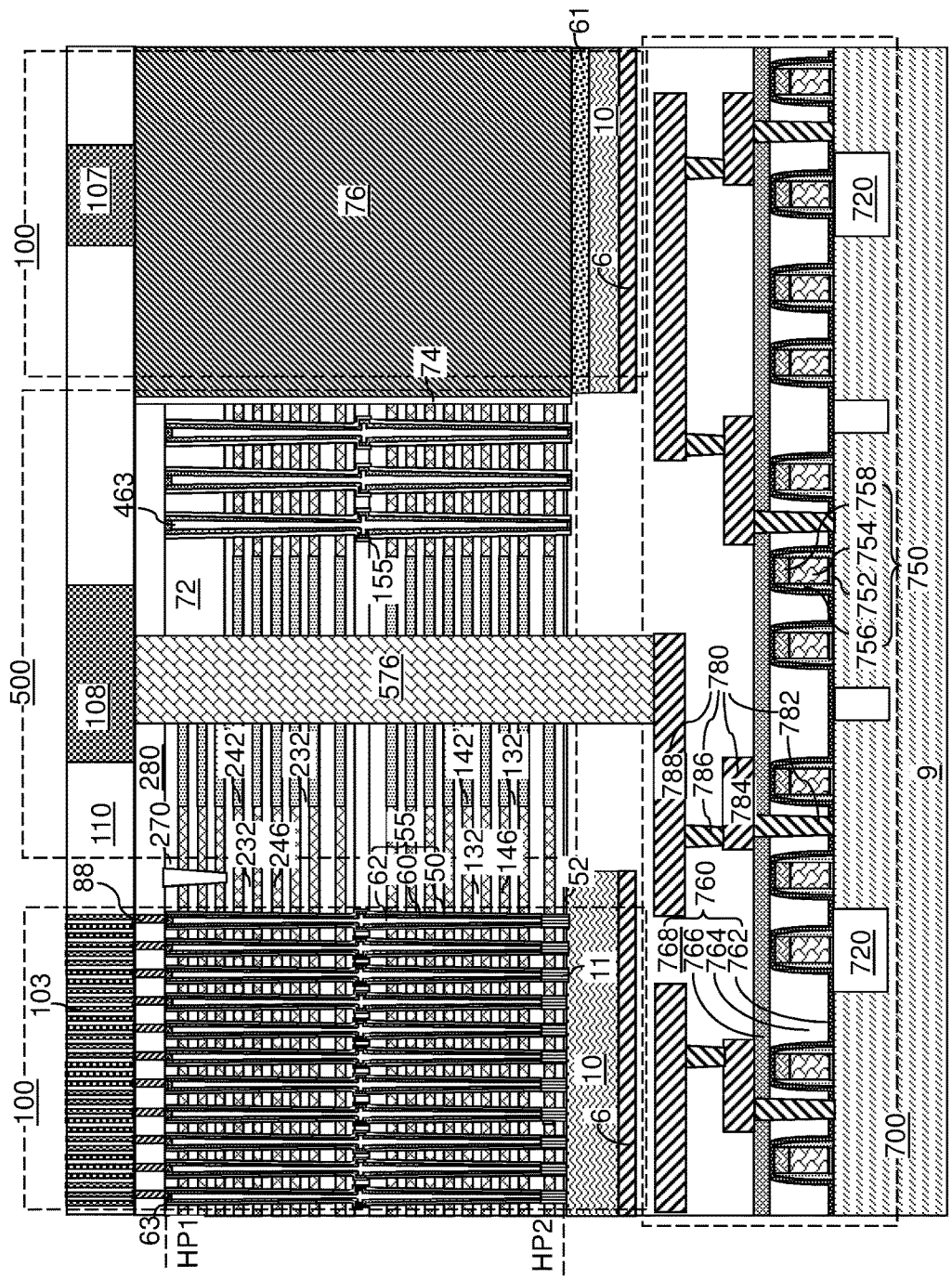
FIG. 11A is a vertical cross-sectional view of the exemplary structure after formation of upper level line structures according to an embodiment of the present disclosure.
Figure 11B:
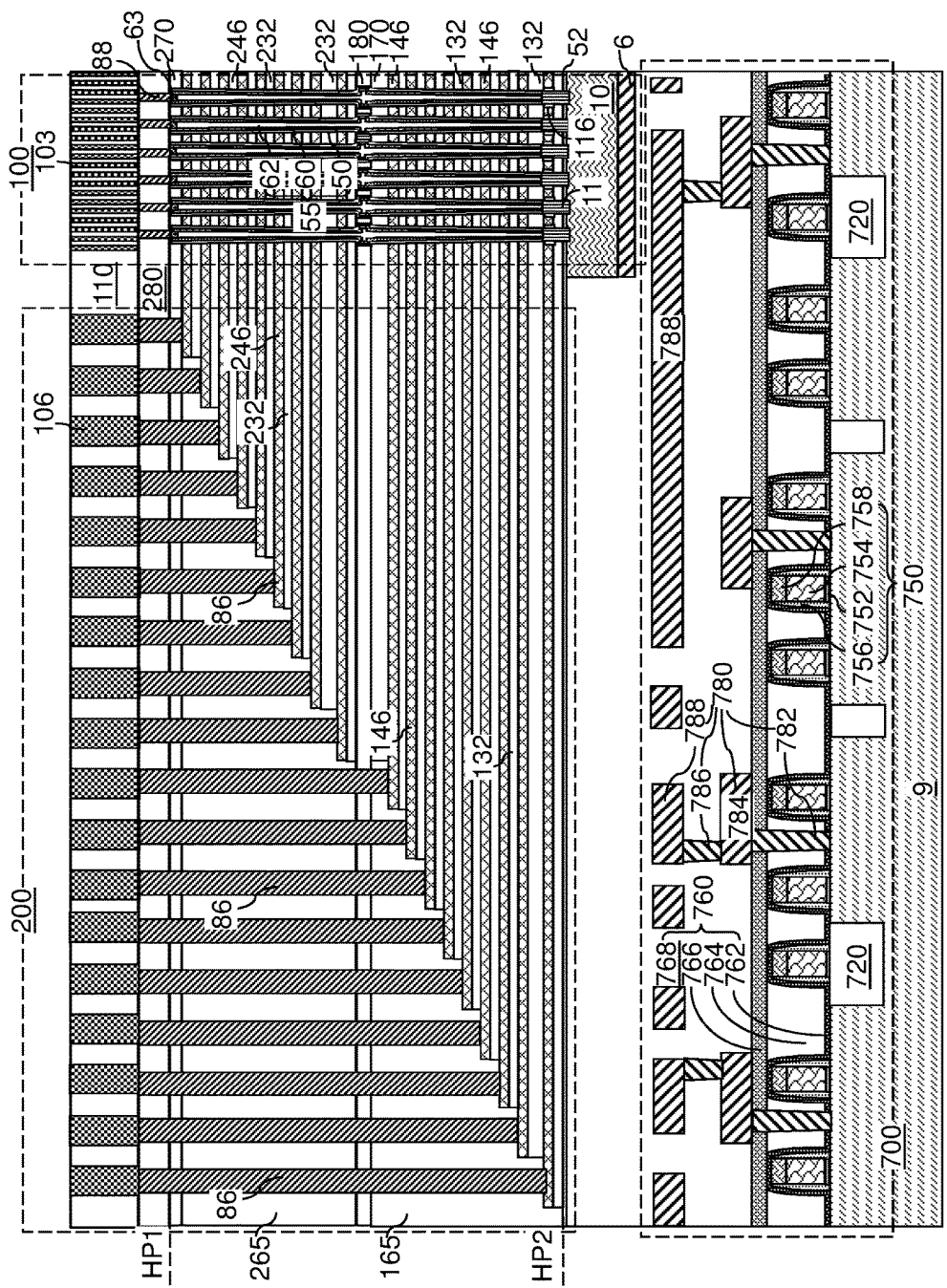
FIG. 11B is a vertical cross-sectional view of another region of the exemplary structure of FIG. 11A.

Generally speaking, at least one alternating stack of insulating layers (132, 232) and spacer dielectric layers (such as sacrificial material layers (142, 242)) can be formed over the planar semiconductor material layer 10, and at least one retro-stepped dielectric material portion (165, 265 as shown in FIG. 11B) can be formed over the staircase regions on the at least one alternating stack (132, 142, 232, 242).

Second-tier memory openings and second-tier support openings can be formed through the second tier structure (232, 242, 270). The second-tier memory openings are formed in areas overlying the sacrificial memory opening fill portions 31. The second-tier support openings are formed in areas overlying the sacrificial via fill portions 131. For example, a photoresist layer (not shown) can be applied over the second tier structure (232, 242, 270), and can be lithographically patterned to form a same pattern as the pattern of the sacrificial memory opening fill portions 31 (i.e., the pattern of the first-tier memory openings) and the pattern of the sacrificial via fill portions 131 (i.e., the pattern of the first-tier support openings). The lithographic mask employed to pattern the first-tier memory openings and the first-tier support openings can be employed to pattern the second-tier memory openings and the second-tier support openings. An anisotropic etch can be performed to transfer the pattern of the lithographically patterned photoresist layer through the second tier structure (232, 242, 270). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 31 can be physically exposed at the bottom of each second-tier memory opening. A top surface of an underlying sacrificial via fill portion 131 can be physically exposed at the bottom of each second-tier support opening. After the top surfaces of the sacrificial memory opening fill portions 31 and the sacrificial via fill portions 131 are physically exposed, an etch process can be performed, which removes the sacrificial material of the sacrificial memory opening fill portions 31 and the sacrificial via fill portions 131 selective to the materials of the second-tier alternating stack (232, 242) and the first-tier alternating stack (132, 142).

Upon removal of the sacrificial memory opening fill portions 31 and the sacrificial via fill portions 131, each vertically adjoining pair of a second-tier memory opening and a first-tier memory opening forms an inter-tier memory opening 49, and each vertically adjoining pair of a second-tier support opening and a first-tier support opening forms an inter-tier support opening 149. Each inter-tier memory opening 49 is a memory opening that includes a continuous cavity that extends through the first-tier alternating stack (132, 142) and the second-tier alternating stack (232, 242) in the memory array region 100. Each inter-tier support opening 149 is a via cavity that includes a continuous cavity that extends through the first-tier alternating stack (132, 142) and the second-tier alternating stack (232, 242) in the through-memory-level via region 500. A top surface of the planar semiconductor material layer 10 can be physically exposed at the bottom of each inter-tier memory opening 49 and at the bottom of each inter-tier support opening 149.

Figure 4A:
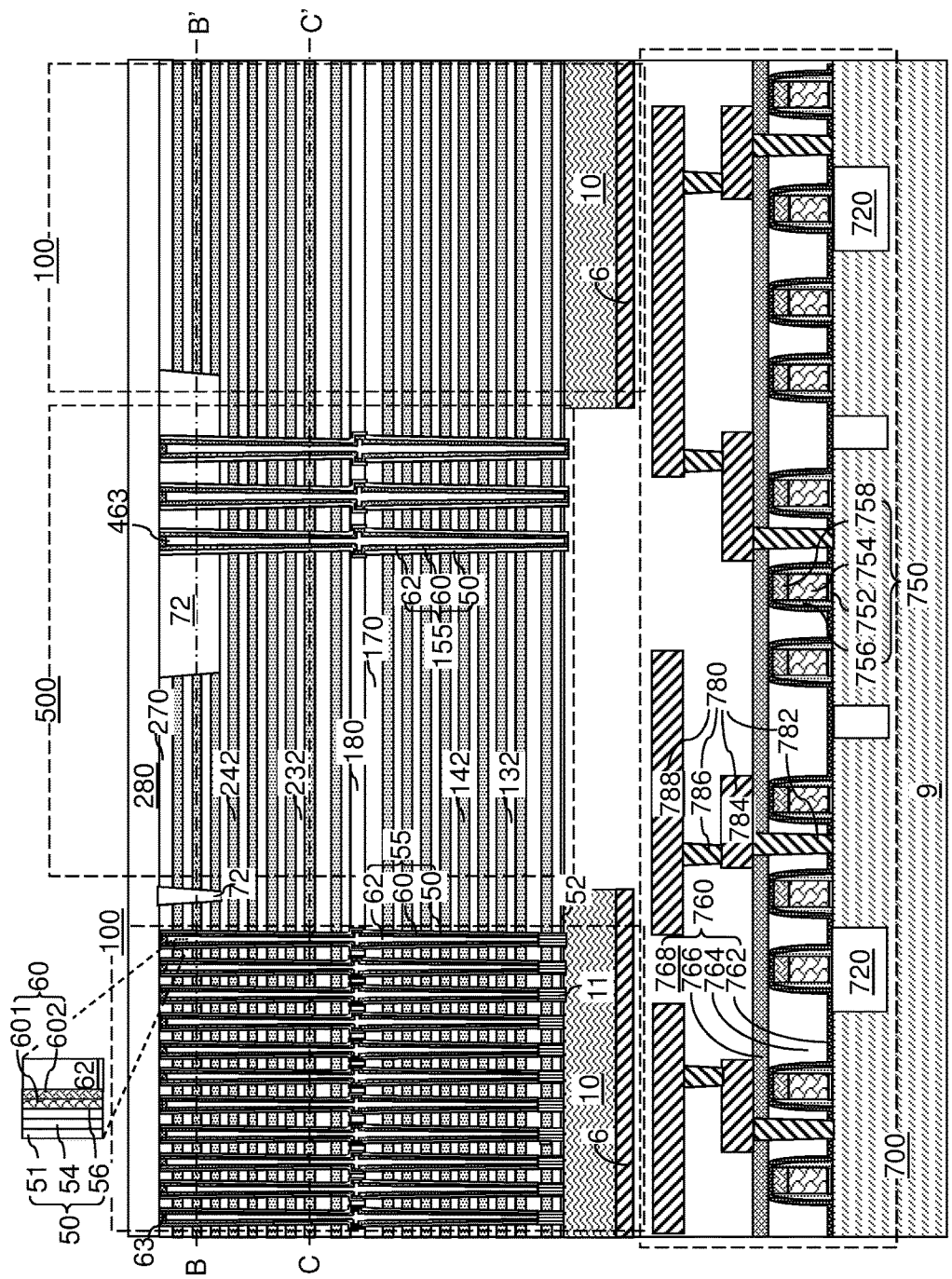
FIG. 4A is a vertical cross-sectional view of the exemplary structure after formation of memory stack structures, support pillar structures, and a contact level dielectric layer according to an embodiment of the present disclosure.
Figure 4B:
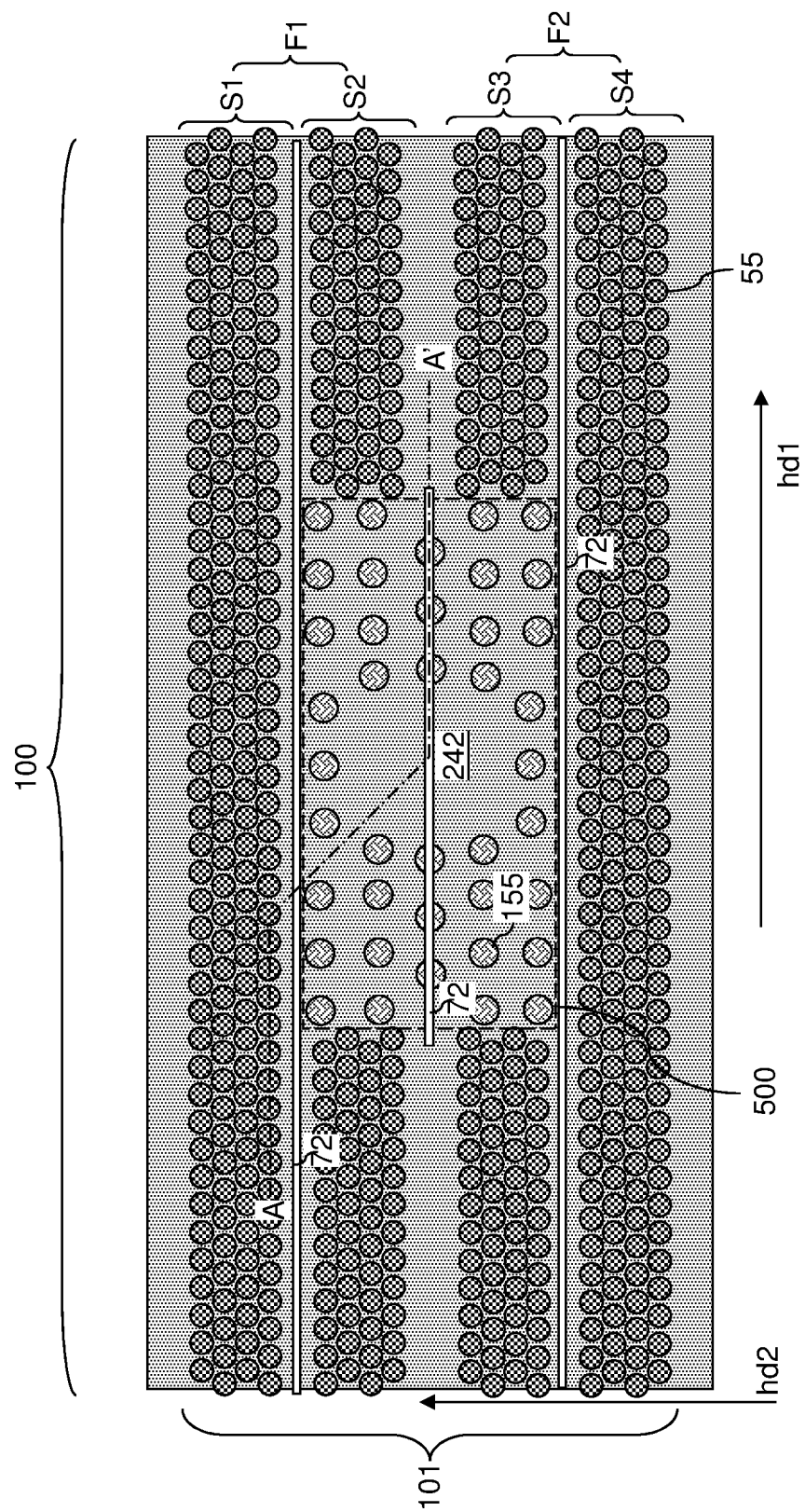
FIG. 4B is a horizontal cross-sectional view of the exemplary structure along the horizontal plane B-B' in FIG. 4A. The zig-zag vertical plane A-A' corresponds to the plane of the vertical cross-sectional view of FIG. 4A.
Figure 4C:
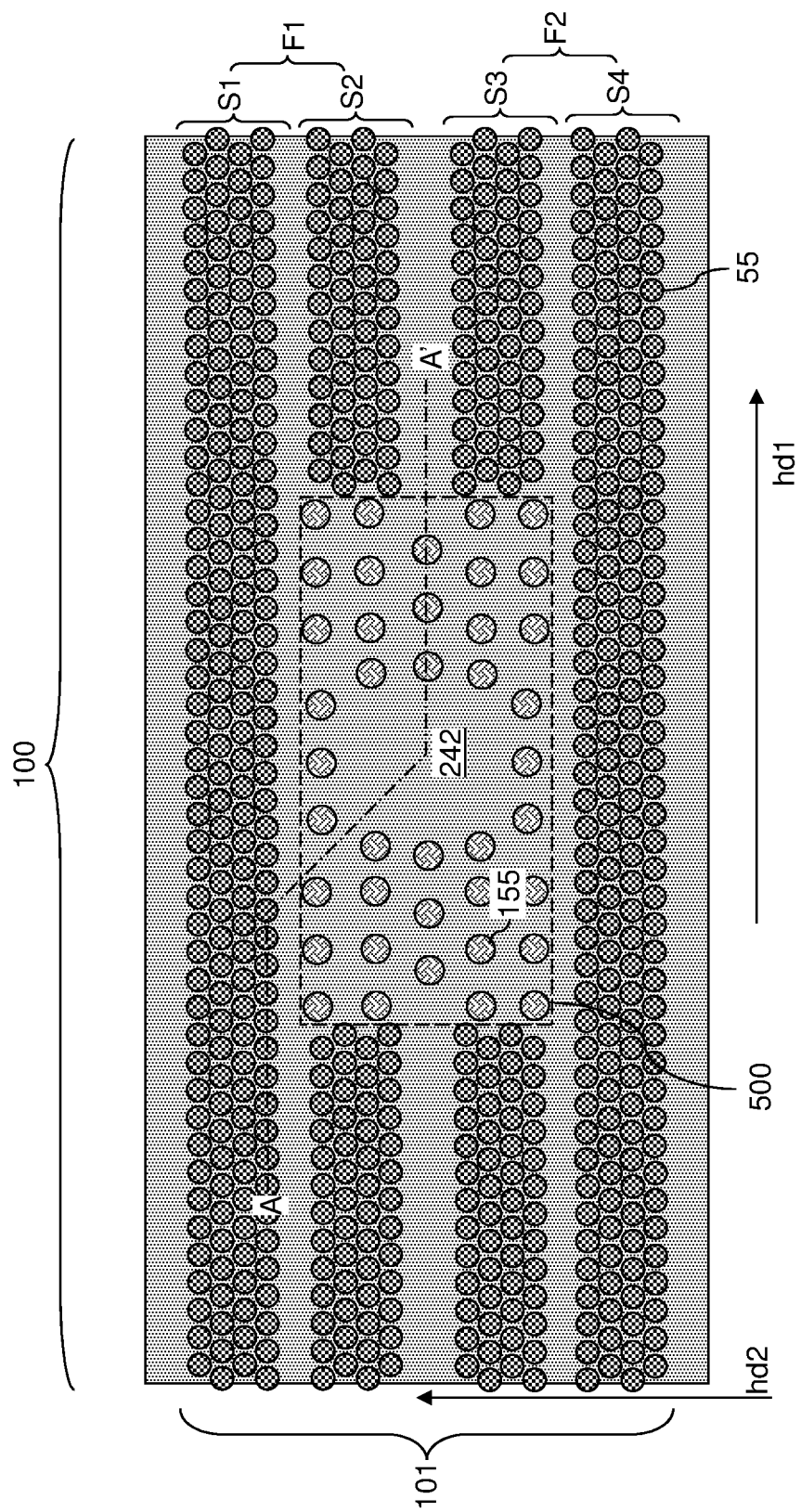
FIG. 4C is a horizontal cross-sectional view of the exemplary structure along the horizontal plane C-C' in FIG. 4A. The zig-zag vertical plane A-A' corresponds to the plane of the vertical cross-sectional view of FIG. 4A.

Referring to FIGS. 4A-4C, pedestal channel portions 11 can be optionally formed at the bottom of each memory opening 49 by a selective semiconductor deposition process. The selective semiconductor deposition grows a semiconductor material only from semiconductor surfaces, i.e., the physically exposed surfaces of the planar semiconductor material layer 10, and suppresses growth of the semiconductor material from insulator surfaces. During a selective semiconductor deposition process, a reactant (such as silane, dichlorosilane, trichlorosilane, disilane, etc.) can be flowed into a deposition chamber simultaneously with, or alternately with, an etchant (such as hydrogen chloride). Because a semiconductor material is deposited at a greater deposition rate on semiconductor surfaces than on insulator surfaces, a selective growth can be achieved by setting the etch rate between the deposition rate of the semiconductor material on semiconductor surfaces and the deposition rate of the semiconductor material on insulator surfaces. In one embodiment, the top surfaces of the pedestal channel portions 11 can extend across the levels of the source select levels in which source-select-level electrically conductive layers can be subsequently formed.

Memory stack structures 55 and support pillar structures 155 can be simultaneously, i.e., concurrently, formed in remaining volumes of the inter-tier memory openings 49 and in the inter-tier support openings 149, respectively. The memory stack structures 55 are formed in the memory array region 100, and the support pillar structures 155 can be formed in the through-memory-level via region 500. Each of the memory stack structures 55 and the support pillar structures 155 comprises a set of material layers including a memory film 50 and a vertical semiconductor layer 60. In an illustrative example, each memory stack structure 55 and each support pillar structure 155 can include a memory film 50, a vertical semiconductor layer 60, and an optional dielectric core 62. In one embodiment, each memory film 50 can include a blocking dielectric layer 51, a memory material layer 54, and a tunneling dielectric layer 56 as illustrated in the inset. In one embodiment, each vertical semiconductor layer 60 can include a first semiconductor channel 601 and a second semiconductor channel 602.

The blocking dielectric layer 51 includes a blocking dielectric layer material such as silicon oxide, a dielectric metal oxide (such as aluminum oxide), or a combination thereof. Alternatively, the blocking dielectric layer 51 may be omitted during this processing step and instead be formed through lateral recesses as will be described in more detail below. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed. Each portion of the memory material layer 54 located at the levels of the spacer material layers, which can be the levels of the sacrificial material layers (142, 242).

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. The thickness of the tunneling dielectric layer 56 can be in a range from 2 nm to 20 nm, although lesser and greater thicknesses can also be employed.

A first semiconductor channel layer can be deposited over the memory films 50 by a conformal deposition method such as low pressure chemical vapor deposition (LPCVD). The thickness of the first semiconductor channel layer can be in a range from 2 nm to 10 nm, although lesser and greater thicknesses can also be employed. The first semiconductor channel layer and the memory films 50 can be anisotropically etched to remove horizontal portions thereof. A horizontal bottom portion of each memory film 50 can be removed from the bottom of each memory opening. Each remaining portion of the first semiconductor channel layer constitutes a first semiconductor channel 601. The first semiconductor channels can include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channels 601 can include amorphous silicon or polysilicon.

A second semiconductor channel layer can be deposited on the first semiconductor channels 601 (i.e., the remaining vertical portions of the first semiconductor channel layer) and on top surface of the epitaxial channel portions 11 (or of the substrate semiconductor layer 10 in case the epitaxial channel portions 11 are not present). The second semiconductor channel layer includes a semiconductor material, which can be any semiconductor material that can be employed for the first semiconductor channel layer. The first and second semiconductor channel layers can have a doping of the first conductivity type (i.e., the same conductivity type as the substrate semiconductor layer 10) or can be substantially intrinsic, i.e., having a dopant concentration that does not exceed $1.0 \times 10^{17}/cm^3$. In one embodiment, the second semiconductor channel layer can include amorphous silicon or polysilicon. The thickness of the second semiconductor channel layer can be in a range from 2 nm to 10 nm, although lesser and greater thicknesses can also be employed.

A dielectric material can be deposited in cavities surrounded by the second semiconductor channel layer, and subsequently recessed below the top surface of the second insulating cap layer 270. Each remaining portion of the dielectric material in the memory openings constitutes a dielectric core 62. A doped semiconductor material having a second conductivity type (which is the opposite of the first conductivity type) can be deposited within recessed regions over the dielectric cores 62. Each portion of the deposited doped semiconductor material in an upper portion of the inter-tier memory opening constitutes a drain region 63.

Each portion of the deposited doped semiconductor material portion in an upper portion of the inter-tier support openings constitutes a dummy drain region 463.

The doped semiconductor material of the drain regions 63 and the dummy drain regions 463 can be, for example, doped polysilicon. Excess portions of the deposited semiconductor material can be removed from above the top surface of the second insulating tier cap layer 270, for example, by chemical mechanical planarization (CMP) or a recess etch to form the drain region 63. Each remaining portion of the second semiconductor channel layer constitutes a second semiconductor channel 602. A combination of a first semiconductor channel 601 and a second semiconductor channel 602 inside a memory opening constitutes a vertical semiconductor layer (e.g., a vertical semiconductor channel) 60.

Each of the memory stack structures 55 comprises a memory film 50 and a vertical semiconductor layer 60 that is adjoined to a respective horizontal channel within the planar semiconductor material layer 10. Each memory film 50 in the memory stack structures 55 can include a blocking dielectric layer 51 contacting a sidewall of the inter-tier memory opening, a plurality of charge storage regions (embodied as portions of a memory material layer 54 at each level of the sacrificial material layers (142, 242)) located on an inner sidewall of the blocking dielectric layer 51, and a tunneling dielectric layer 56 located inside the plurality of charge storage regions.

The first tier structure (132, 142, 170), the second tier structure (232, 242, 270), the inter-tier dielectric layer 180, the memory stack structures 55, and the support pillar structures 155 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Optionally, drain-select-level shallow trench isolation structures 72 can be formed through a subset of layers in an upper portion of the second-tier alternating stack (232, 242). The drain-select-level shallow trench isolation structures 72 extend along the first lengthwise direction hd1 through a subset of layers in an upper portion of the at least one alternating stack (132, 142, 232, 242). The second sacrificial material layers 242 that are cut by the select-drain-level shallow trench isolation structures 72 correspond to the levels in which drain-select-level electrically conductive layers (e.g., drain select gate electrodes) are subsequently formed. The drain-select-level shallow trench isolation structures 72 divide blocks of memory stack structures 55 into multiple sub-blocks along the first horizontal direction hd1. The drain-select-level shallow trench isolation structures 72 include a dielectric material such as silicon oxide.

In one embodiment, the exemplary structure can include multiple blocks 101 such that each block 101 includes a memory array region 100 that encloses one or more through-memory-level via regions 500. The memory stack structures 55 and the support pillar structures 155 can be arranged such that the memory stack structures 55 are located in a memory array region 100 and the support pillar structures 155 are located in the one or more through-memory-level via regions 500. Each block 101 includes a first finger F1 and a second finger F2 that extend along the first horizontal direction hd1 and adjacent to each other along a second horizontal direction hd2 that is perpendicular to the first horizontal direction hd1. Each finger (F1, F2) can include a drain-select-level shallow trench isolation structure 72 that laterally extends along the first horizontal direction hd1 and divides the respective finger (F1 or F2) into a pair of strips, such as a pair of a first strip S1 and a second strip S2, or a pair of a third strip S3 and a fourth strip S4. In one embodiment, a through-memory-stack via region 500 can be laterally bound by a pair of drain-select-level shallow trench isolation structures 72 along the second horizontal direction hd2, and can be located between two groups of memory stack structures 55 laterally spaced apart along the first horizontal direction hd1 by the through-memory-level via region 500. Another drain-select-level shallow trench isolation structure 72 divides region 500 along the first horizontal direction hd1, as shown in FIG. 4B.

A contact level dielectric layer 280 can be formed over the memory-level assembly. The contact level dielectric layer 280 is formed at a contact level through which various contact via structures are subsequently formed to the drain regions 63 and the various electrically conductive layers that replaces the sacrificial material layers (142, 242) in subsequent processing steps.

Figure 5A:
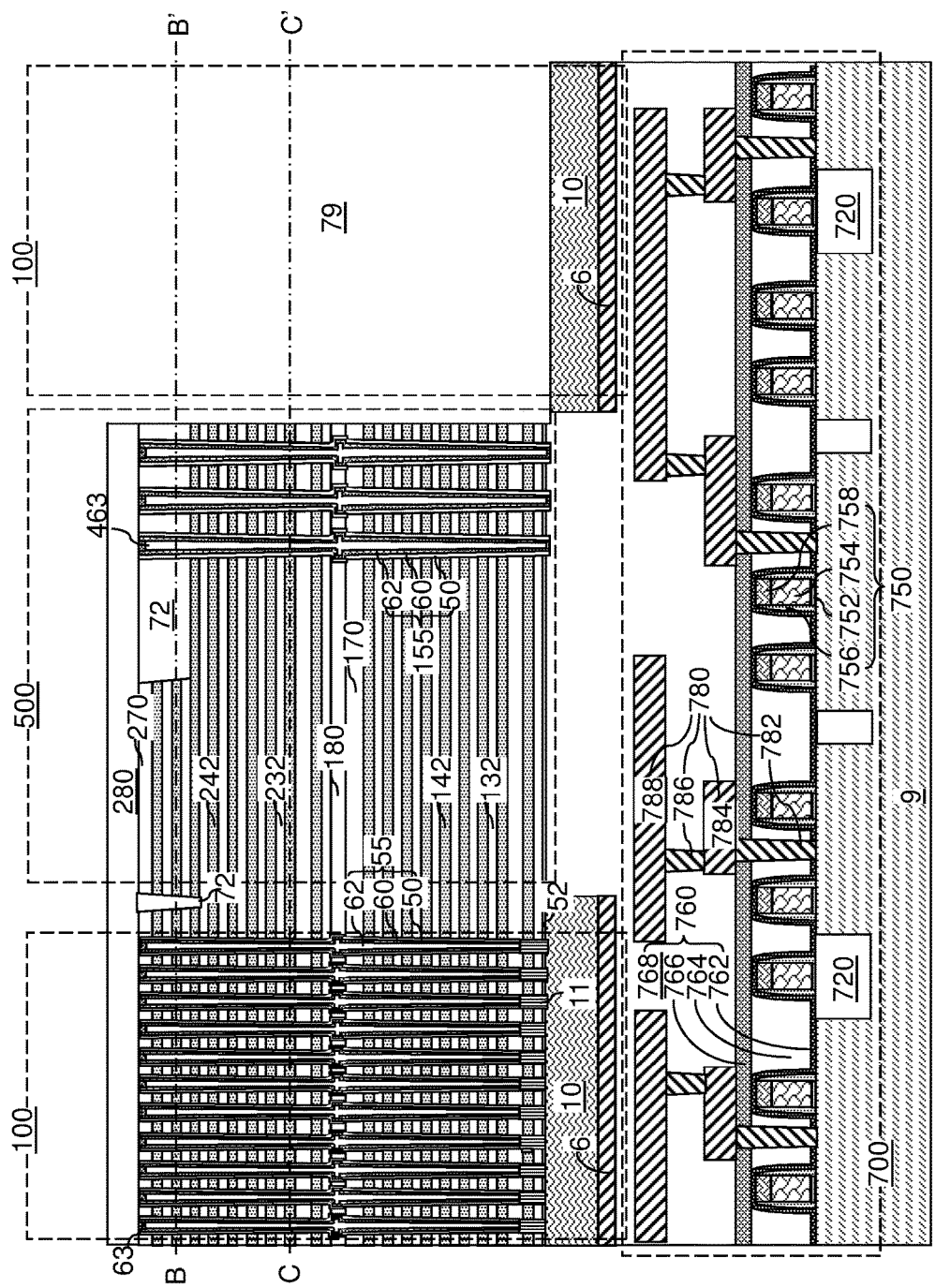
FIG. 5A is a vertical cross-sectional view of the exemplary structure after formation of contact trenches according to an embodiment of the present disclosure.
Figure 5B:
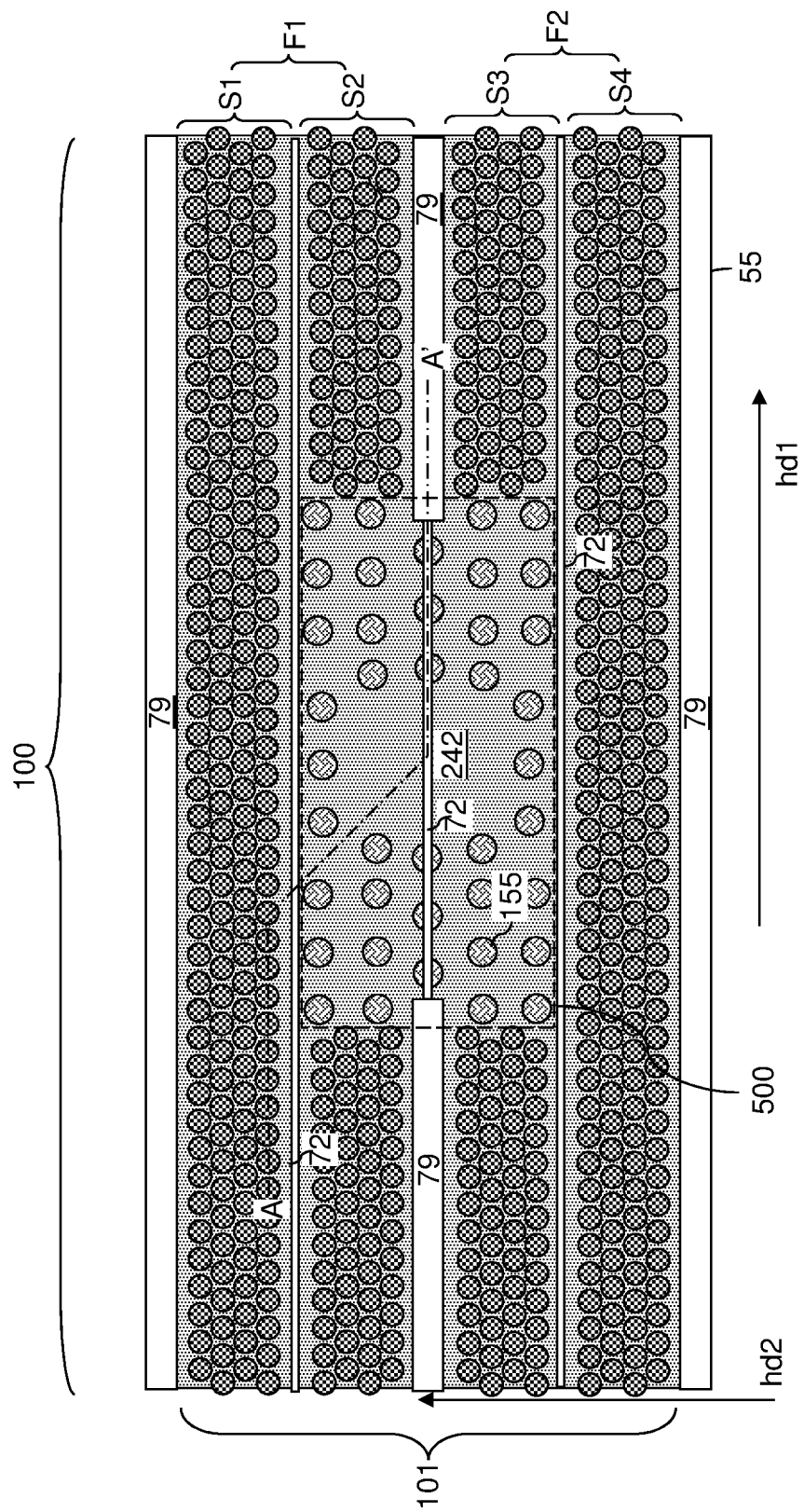
FIG. 5B is a horizontal cross-sectional view of the exemplary structure along the horizontal plane B-B' in FIG. 5A. The zig-zag vertical plane A-A' corresponds to the plane of the vertical cross-sectional view of FIG. 5A.
Figure 5C:
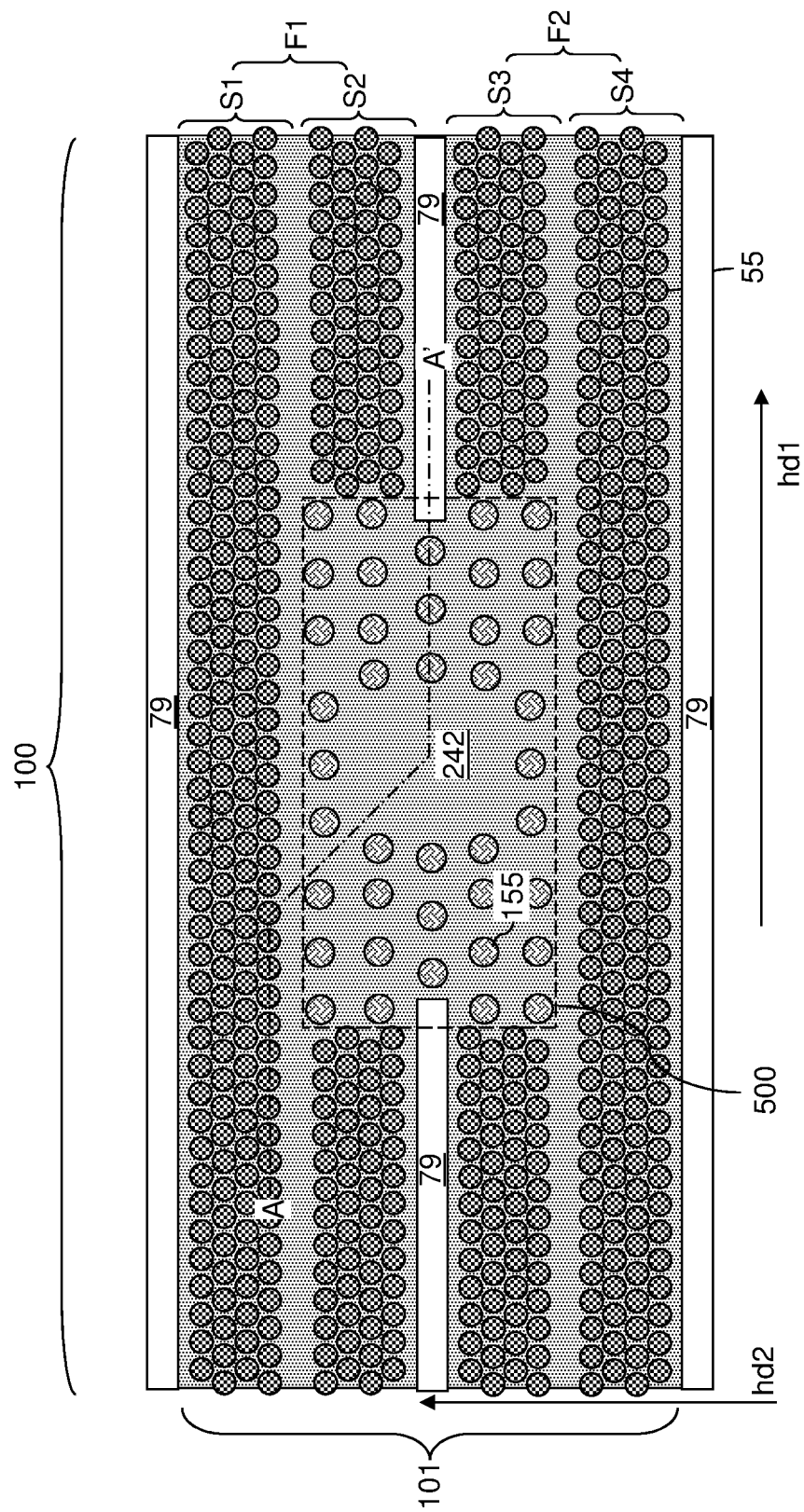
FIG. 5C is a horizontal cross-sectional view of the exemplary structure along the horizontal plane C-C' in FIG. 5A. The zig-zag vertical plane A-A' corresponds to the plane of the vertical cross-sectional view of FIG. 5A.

Referring to FIGS. 5A-5C, contact trenches 79 are subsequently formed through the contact level dielectric layer 280 and the memory-level assembly. Each contact trench 79 is a contact trench in which a contact via structure is subsequently formed. Each contact trench 79 provides an opening through the at least one alternating stack (132, 142, 232, 242) at a "backside" of the memory stack structures 55, i.e., at locations that are laterally offset from the locations of the memory stack structures 55. The contact trenches 79 extend along the first horizontal direction hd1. For example, the length of each contact trench 79 along the first horizontal direction hd1 can be greater than the width of the corresponding contact trench 79 along the second horizontal direction hd2 by a factor greater than 10.

For example, a photoresist layer can be applied and lithographically patterned over the contact level dielectric layer 280 to form elongated openings that extend along the first horizontal direction hd1. A first subset of the openings in the patterned photoresist layer fall on the boundaries between blocks (corresponding to the areas of the contact trenches 79 that border the first strip S1 and the fourth strip S4). A second subset of the openings in the patterned photoresist layer can adjoin sides of each through-memory-level via region 500 that extend along the second horizontal direction hd2. In one embodiment, each through-memory-level via region 500 can be located between a pair of openings in the photoresist layer (corresponding to the areas of the contact trenches 79 that adjoin the illustrated through-memory-level via region 500). No openings are formed in the photoresist layer in region 500. An anisotropic etch is performed to transfer the pattern in the patterned photoresist layer through the contact level dielectric layer 280 and the memory-level assembly to a top surface of the planar semiconductor material layer 10. The photoresist layer can be subsequently removed, for example, by ashing.

The contact trenches 79 extend along the first horizontal direction hd1, and thus, are elongated along the first horizontal direction hd1. The contact trenches 79 are formed through the memory-level assembly, laterally extends along the first horizontal direction hd1, and laterally divides the memory-level assembly (which generally includes at least one alternating stack (132, 142, 232, 242) into a plurality of laterally spaced-apart blocks 101 that are repeated along the second horizontal direction hd2.

Each block 101 includes a respective portion of the memory array region between a neighboring pair of contact trenches 79 among a first subset of the contact trenches 79, which are formed within the area of the first subset of the openings in the photoresist layer. Each block 101, each finger (F1, F2), and each strip (S1, S2, S3, S4) can extend along a lengthwise direction, which is the first horizontal direction hd1. Each block can include the respective portion of the memory array region 100, a staircase region (not shown) located on one lengthwise end of the respective portion of the memory array region 100 and including a word line contact via region, and another staircase region located on another lengthwise end of the respective portion of the memory array region 100. Region 100 includes a through-memory-level via region 500. In one embodiment, the placement of the word line contact via regions along consecutive blocks can alternate between two opposite sides.

A second subset of contact trenches 79 may be provided within each block 101. The second subset of contact trenches 79 is formed within the area of the second subset of the openings in the photoresist layer. The second subset of contact trenches 79 can extend along the first horizontal direction hd1, and can be positioned to suitably divide each block into a plurality of sub-blocks, i.e., fingers (F1, F2), and can adjoin a respective drain-select-level shallow trench isolation structure 72 in region 500. In other words, second subset of contact trenches 79 does not extend through region 500 and the portions of a contract trench 79 from the second set are connected in the first horizontal direction hd1 in region 500 by a drain-select-level shallow trench isolation structure 72, as shown in FIG. 5B. If the drain-select-level shallow trench isolation structures 72 are employed, the drain-select-level shallow trench isolation structures 72 can extend along the first horizontal direction hd1 to divide a subset of layers in an upper portion of the second-tier alternating stack (232, 242) within region 500, within each sub-block (i.e., finger) or within each block. Various design optimizations can be employed to divide a block into sub-blocks or subordinate units.

Figure 6A:
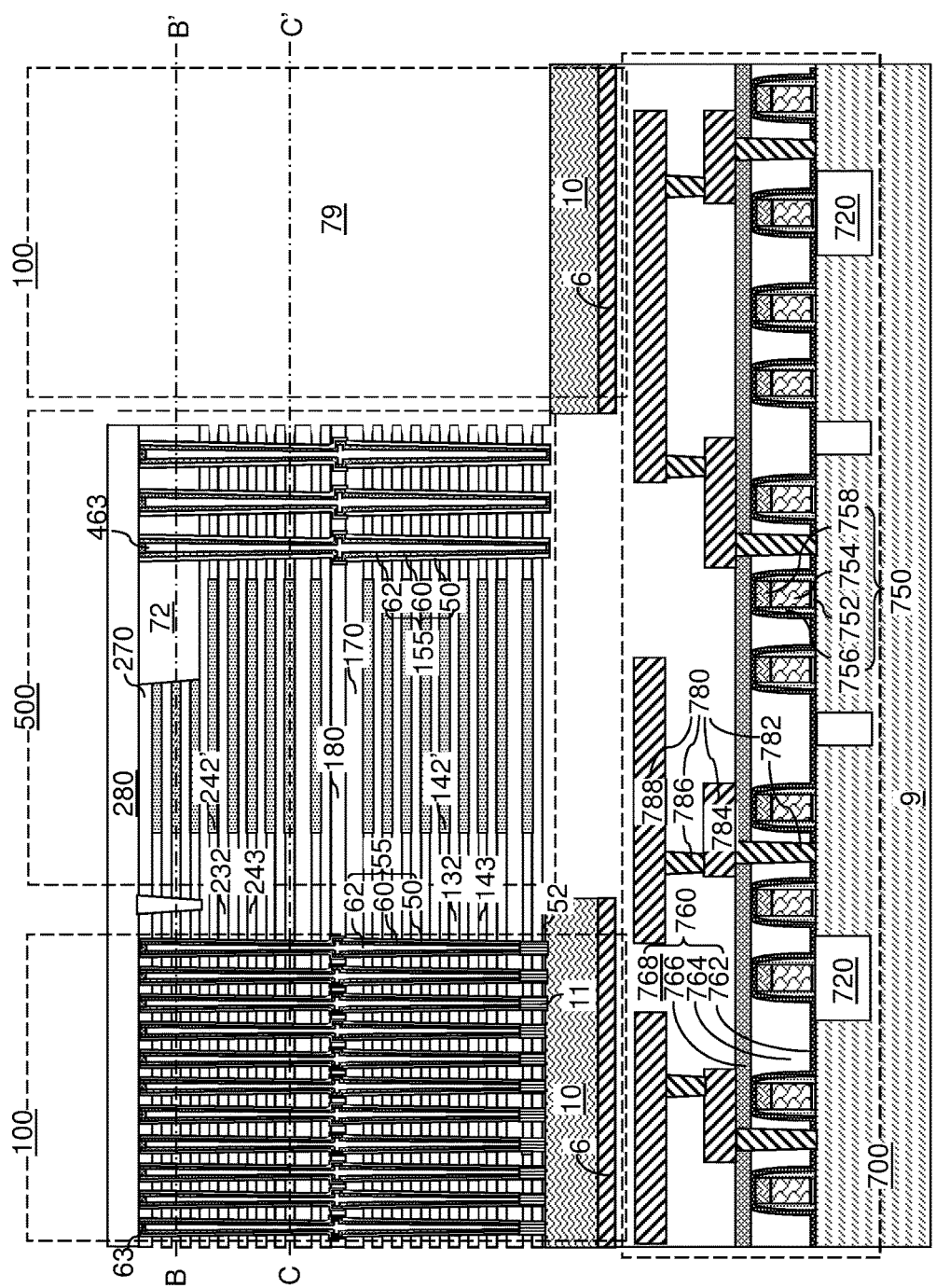
FIG. 6A is a vertical cross-sectional view of the exemplary structure after formation of lateral recesses by removal of the spacer dielectric layers according to an embodiment of the present disclosure.
Figure 6B:
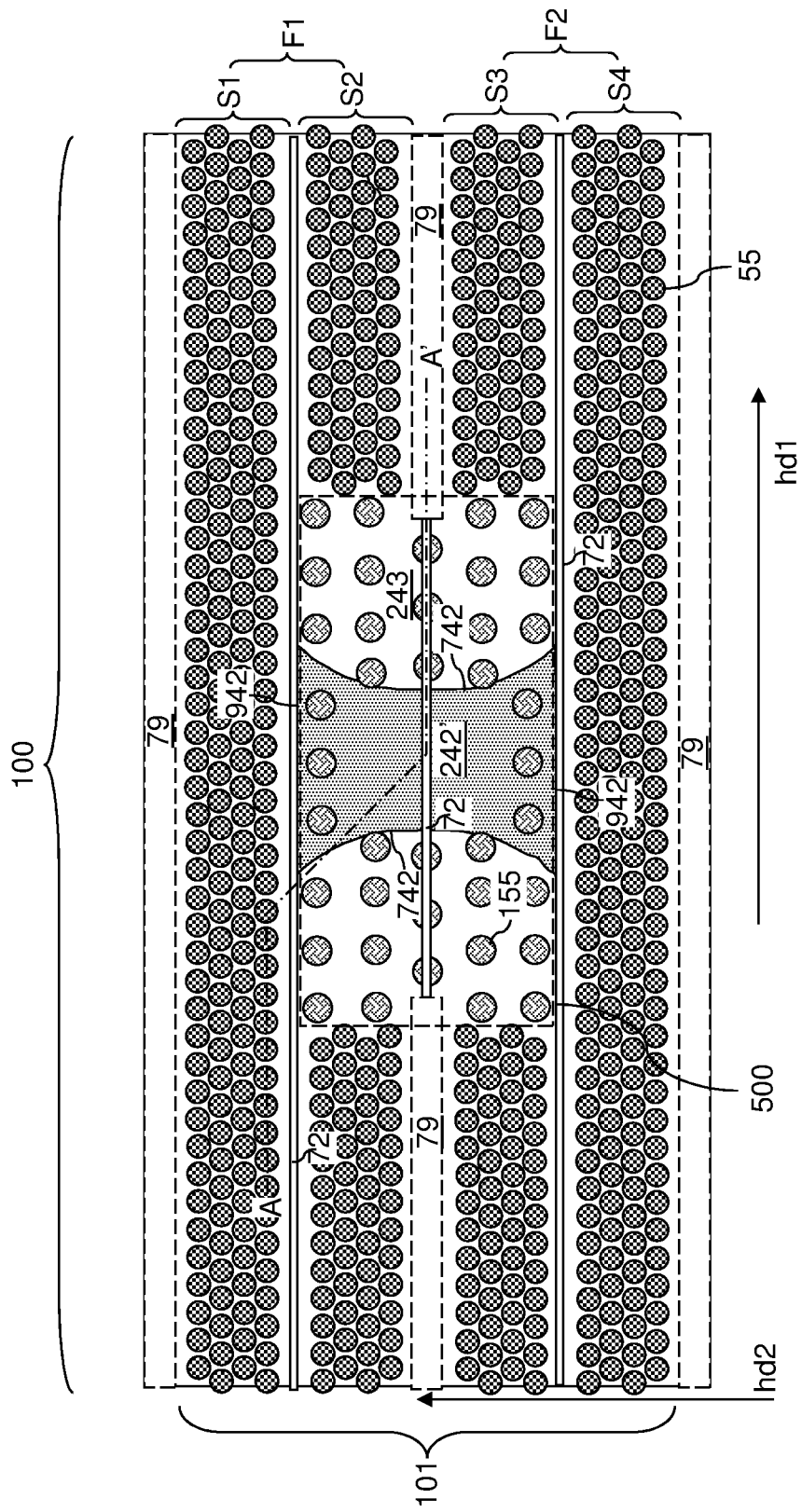
FIG. 6B is a horizontal cross-sectional view of the exemplary structure along the horizontal plane B-B' in FIG. 6A. The zig-zag vertical plane A-A' corresponds to the plane of the vertical cross-sectional view of FIG. 6A.
Figure 6C:
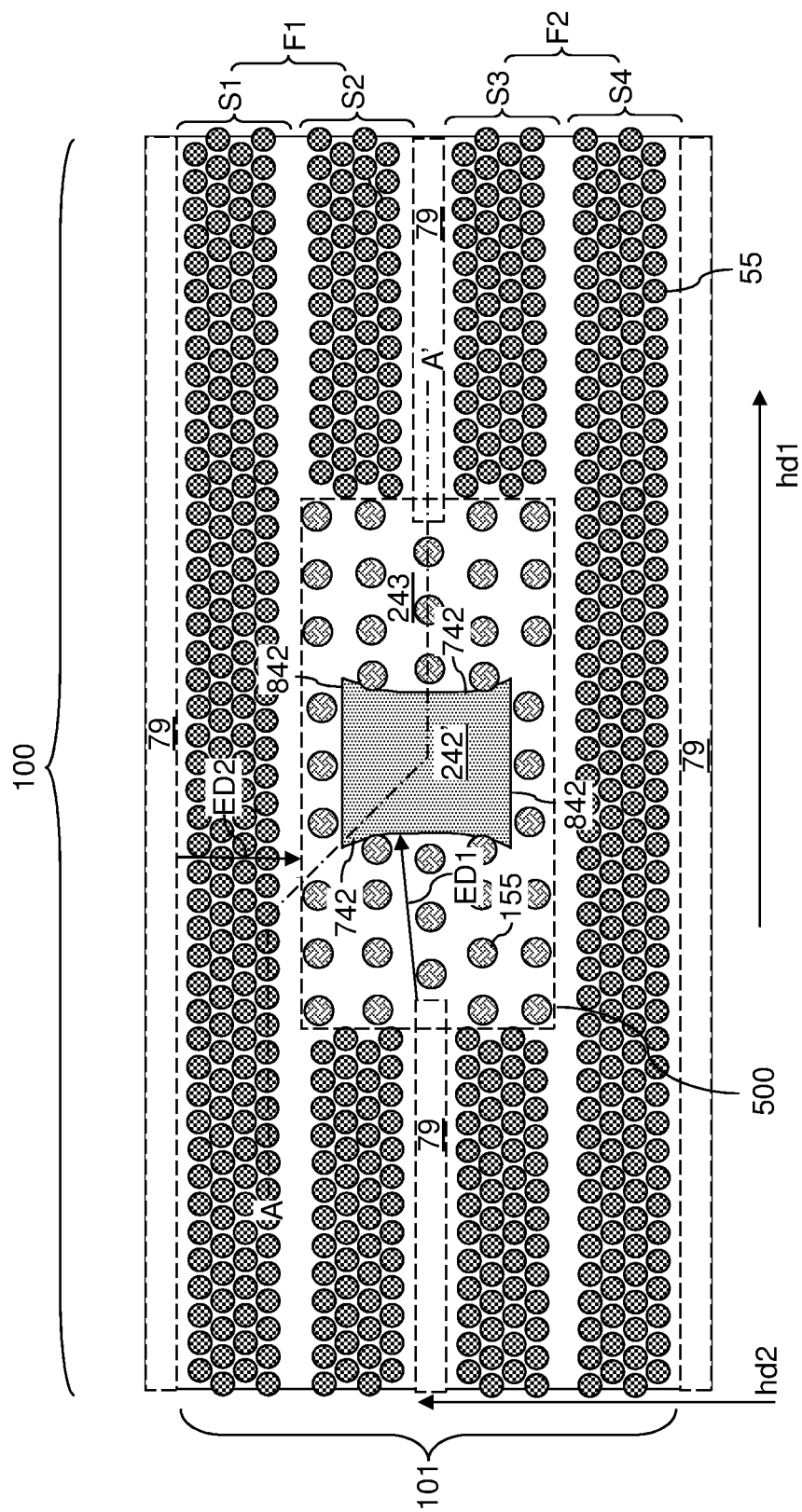
FIG. 6C is a horizontal cross-sectional view of the exemplary structure along the horizontal plane C-C' in FIG. 6A. The zig-zag vertical plane A-A' corresponds to the plane of the vertical cross-sectional view of FIG. 6A.

Referring to FIGS. 6A-6C, lateral recesses (143, 243) are formed by providing an etchant that etches materials of the sacrificial material layers (142, 242) selective to materials of the insulating layers (132, 232) through the contact trenches 79. Specifically, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the contact trenches 79, for example, employing an isotropic etch process. The duration of the etch process is limited so that removal of the sacrificial material layers (142, 242) is limited to a predetermined lateral distance from sidewalls of the contact trenches 79.

First lateral recesses 143 are formed in volumes from which the first sacrificial material layers 142 are removed. Second lateral recesses 243 are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the contact trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second lateral recesses (143, 243) can be a laterally extending cavity having a lateral dimension that is greater than the vertical extent of the cavity. In other words, the lateral dimension of each of the first and second lateral recesses (143, 243) can be greater than the height of the respective lateral recess (143, 243). A plurality of first lateral recesses 143 can be formed in the volumes from which the material of the first sacrificial material layers 142 is removed. A plurality of second lateral recesses 243 can be formed in the volumes from which the material of the second sacrificial material layers 242 is removed. Each of the first and second lateral recesses (143, 243) can extend substantially parallel to the top surface of the substrate 10. A lateral recess (143, 243) can be vertically bounded by a top surface of an underlying insulating layer (132 or 232) and a bottom surface of an overlying insulating layer (132 or 232). In one embodiment, each of the first and second lateral recesses (143, 243) can have a uniform height throughout.

Portions of the sacrificial material layers (142, 242) are removed selective to the insulating layers (132, 232) within the lateral etch distance from sidewalls of the contact trenches 79 to form the first and second lateral recesses (143, 243). Remaining portions of the sacrificial material layers (142, 242) within the at least one alternating stack (e.g., in region 500 which lacks trenches 79) constitute spacer dielectric portions (142', 242'). The spacer dielectric portions (142', 242') include first spacer dielectric portions 142' that are remaining portions of the first sacrificial material layers 142, and second spacer dielectric portions 242' that are remaining portions of the second sacrificial material layers 242.

In one embodiment, each of the spacer dielectric portions (142', 242') may have a pair of concave sidewalls 742 that are substantially equidistant from a most proximal sidewall of a first pair of contact trenches 79 that adjoins a respective through-memory-stack via region 500 (such as the contact trenches dividing the second strip S2 and the third strip S3). As used herein, first elements are "substantially equidistant from" second elements if variations among the distances between the first elements and the second elements are within 5%. The variations among the lateral distance between sidewalls of the spacer dielectric portions (142', 242') and the respective most proximal sidewalls of the contact trenches 79 can be due to the presence of the support pillar structures 155, which prevent etching of the sacrificial material layers (142, 242) along straight lines intersected by the support pillar structures 155. The average distance between the concave sidewalls 742 and the respective most proximal sidewalls of the contact trenches 79 is herein referred to as a first etch distance ED1.

A first subset of the spacer dielectric portions (142', 242') is located at levels other than the levels of the drain-select-level shallow trench isolation structures 72, as shown in FIG. 6C. A second subset of the spacer dielectric portions, which is a subset of the second spacer dielectric portions 242', is located at levels of the drain-select-level shallow trench isolation structures 72, as shown in FIG. 6B.

The first subset of spacer dielectric portions (142', 242') has respective pairs of substantially parallel straight sidewalls 842 that are substantially equidistant from a most proximal sidewall of a second pair of contact trenches 79 that are laterally spaced from the through-memory-stack via region 500 (such as the contact trenches 79 adjoining the first strip S1 or the fourth strip S4). Thus, at levels in which the drain-select-level shallow trench isolation structures 72 are not present, all sidewalls of the spacer dielectric portions (142', 242') can be substantially equidistant from a most proximal sidewall of the contact trenches 79 by a second etch distance ED2, which is substantially the same as the first etch distance ED1, as shown in FIG. 6C. As used herein, a second distance is substantially the same a first distance if the second distance does not differ from the first distance by more than 5%.

At levels of the drain-select-level shallow trench isolation structures 72, the lateral extent of the second lateral recesses 243 is bounded by, and does not proceed farther than, a sidewall of the drain-select-level shallow trench isolation structures 72. The second subset of spacer dielectric portions 242' can have respective pairs of parallel straight sidewalls 942 that contact sidewalls of the drain-select-level shallow trench isolation structures 72 that extend along the first horizontal direction hd1, as shown in FIG. 6B. In this case, at levels in which the drain-select-level shallow trench isolation structures 72 are present, the parallel straight sidewalls 942 can be laterally spaced from respective most proximal sidewalls of the contact trenches 79 by a lesser distance than the second etch distance ED2.

In one embodiment, a sidewall surface of each pedestal channel portion 11 can be physically exposed at each bottommost first lateral recess 143 after removal of portions of the first and second sacrificial material layers (142, 242). Further, a top surface of the planar semiconductor material layer 10 can be physically exposed at the bottom of each contact trench 79. An annular dielectric spacer (not shown) can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

Figure 7A:
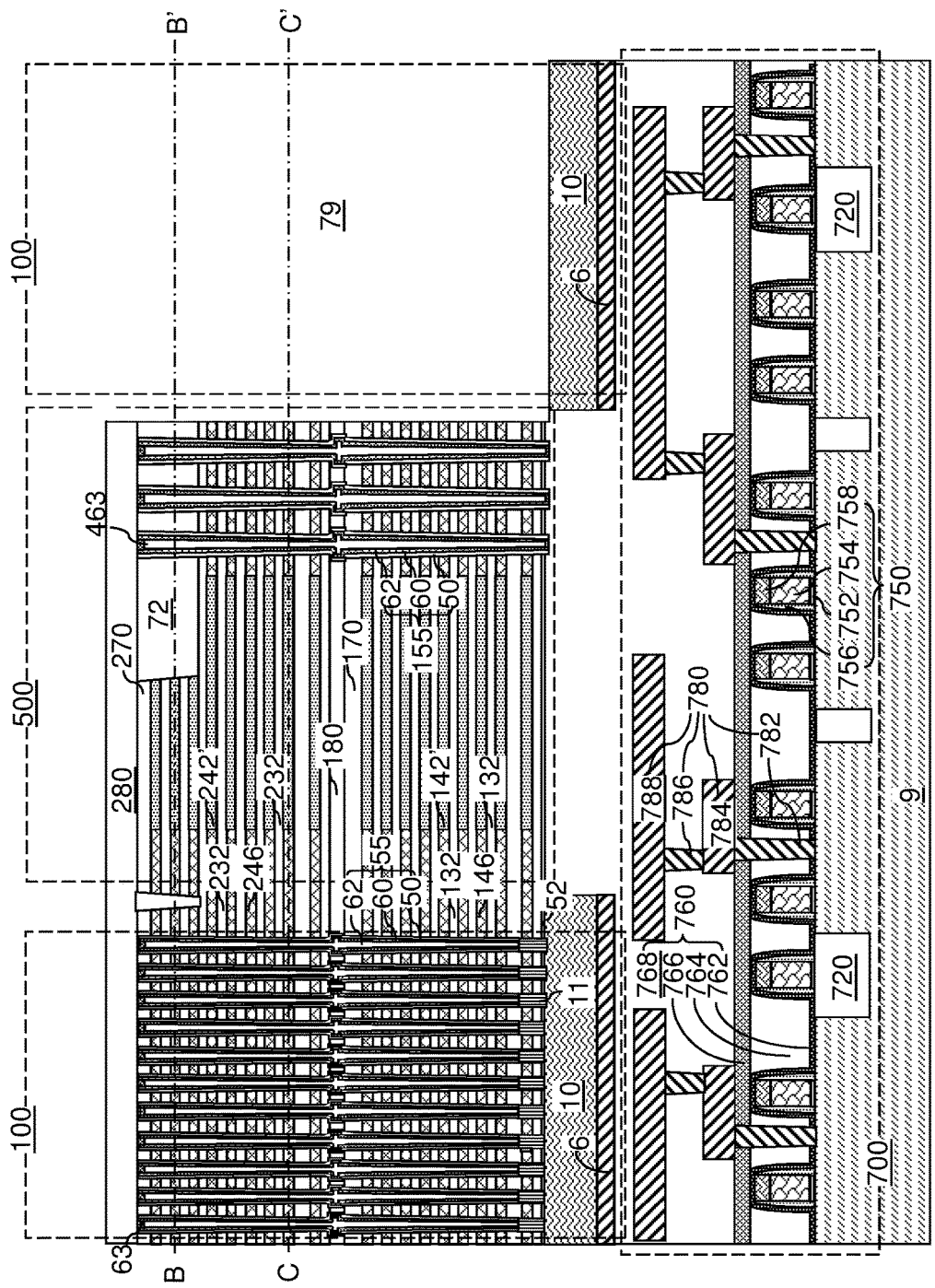
FIG. 7A is a vertical cross-sectional view of the exemplary structure after formation of electrically conductive layers in the baskside recesses according to an embodiment of the present disclosure.
Figure 7B:
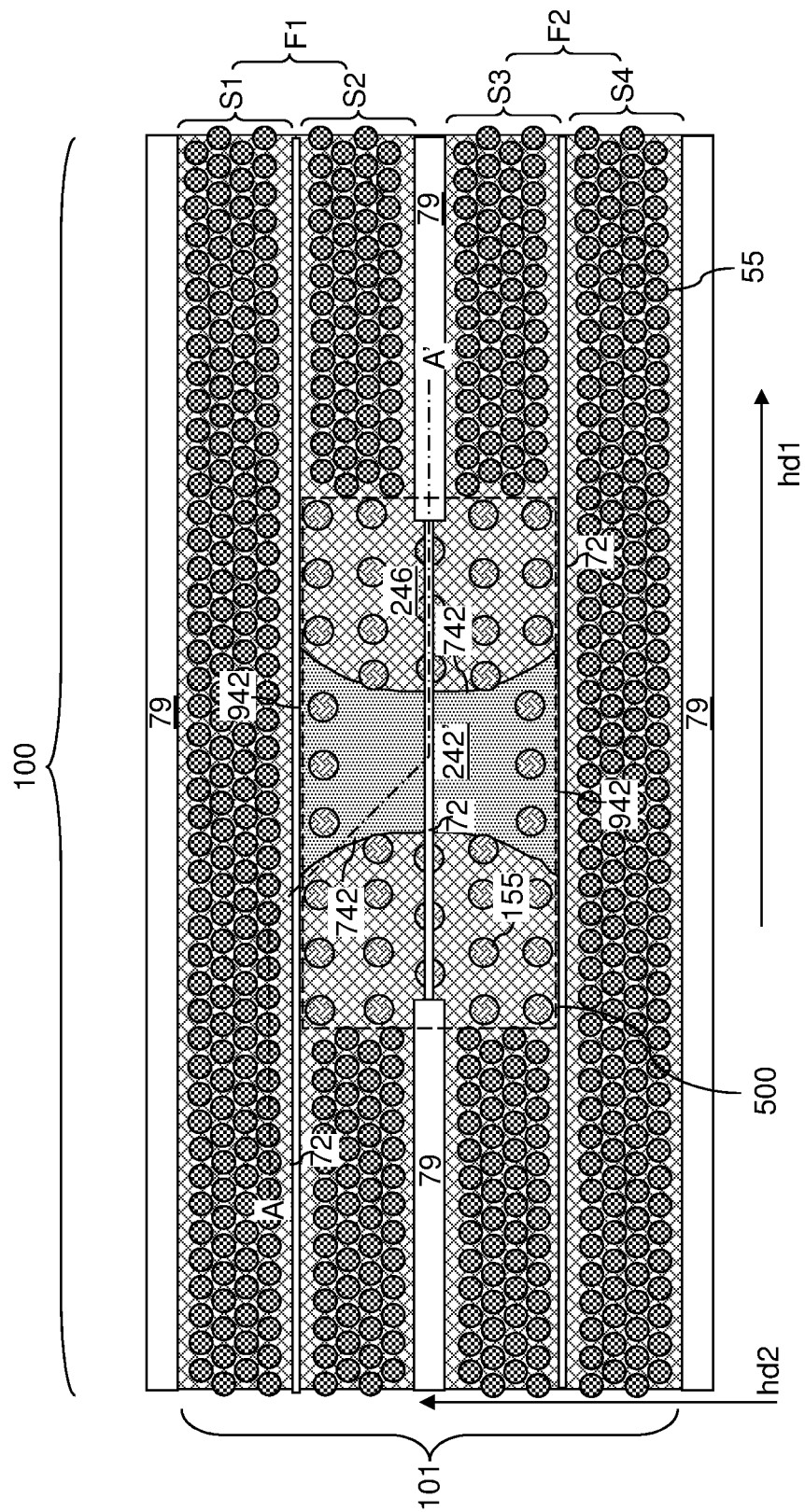
FIG. 7B is a horizontal cross-sectional view of the exemplary structure along the horizontal plane B-B' in FIG. 7A. The zig-zag vertical plane A-A' corresponds to the plane of the vertical cross-sectional view of FIG. 7A.
Figure 7C:
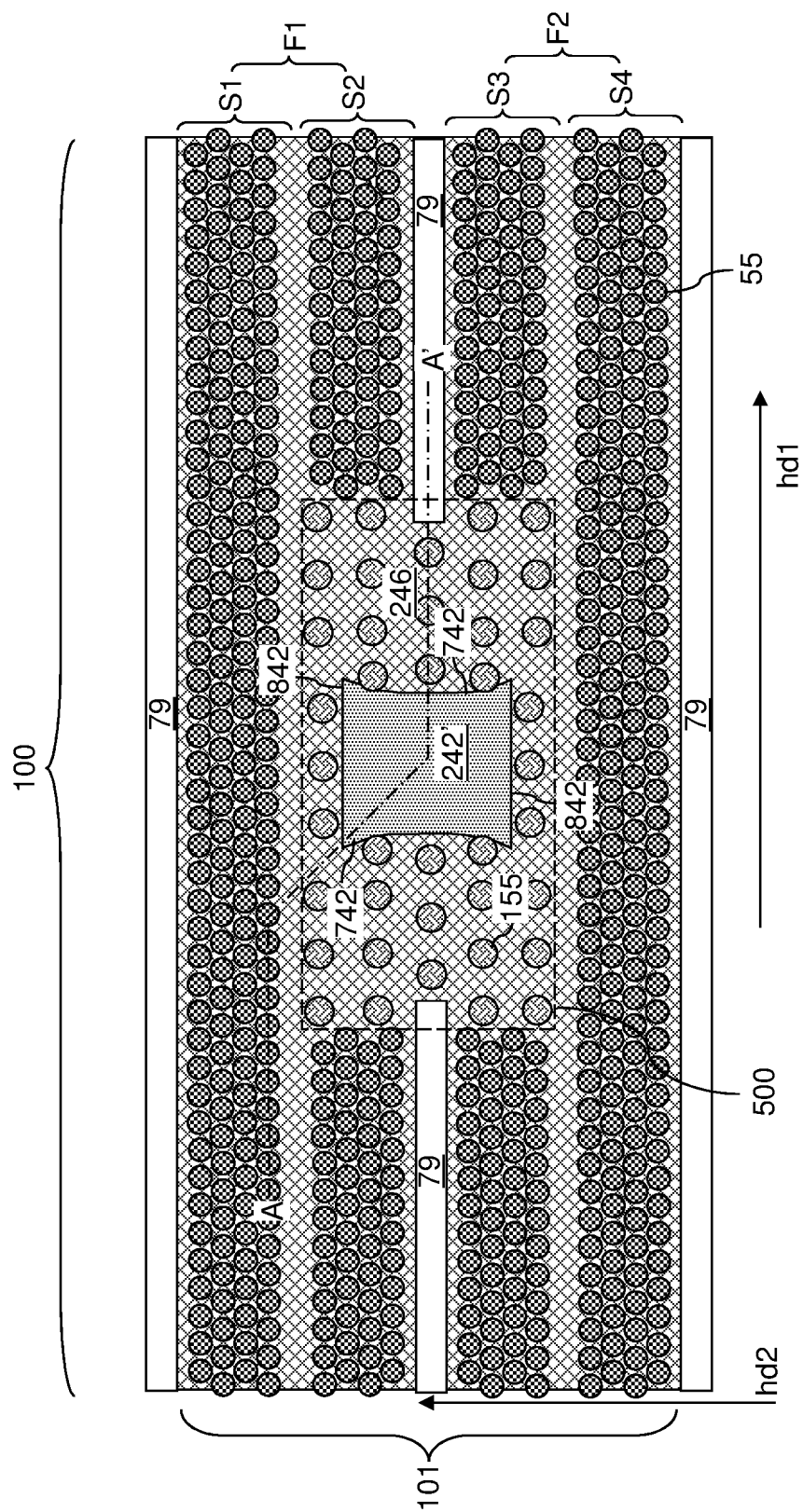
FIG. 7C is a horizontal cross-sectional view of the exemplary structure along the horizontal plane C-C' in FIG. 7A. The zig-zag vertical plane A-A' corresponds to the plane of the vertical cross-sectional view of FIG. 7A.

Referring to FIGS. 7A-7C, a backside blocking dielectric layer (not shown) can be optionally deposited in the lateral recesses (143, 243) and the contact trenches 79 and over the contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of lateral recesses (143, 243), on the sidewalls of the contact trench 79, and over the contact level dielectric layer 280. The at least one conductive material can include at least one metallic material, i.e., an electrically conductive material that includes at least one metallic element.

A plurality of first electrically conductive layers 146 can be formed in the plurality of first lateral recesses 143, a plurality of second electrically conductive layers 246 can be formed in the plurality of second lateral recesses 243, and a continuous metallic material layer (not shown) can be formed on the sidewalls of each contact trench 79 and over the contact level dielectric layer 280. Thus, portions of the first and second sacrificial material layers (142, 242) can be replaced with the first and second conductive material layers (146, 246), respectively. Specifically, each removed portion of the first sacrificial material layers 142 can be replaced with a portion of the backside blocking dielectric layer and a first electrically conductive layer 146, and each removed portion of the second sacrificial material layers 242 can be replaced with a portion of the backside blocking dielectric layer and a second electrically conductive layer 246. A backside cavity is present in the portion of each contact trench 79 that is not filled with the continuous metallic material layer 46L.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the lateral recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the lateral recesses (143, 243) can be a combination of titanium nitride layer and a tungsten fill material. In one embodiment, the metallic material can be deposited by chemical vapor deposition or atomic layer deposition.

Residual conductive material can be removed from inside the contact trenches 79. Specifically, the deposited metallic material of the continuous metallic material layer can be etched back from the sidewalls of each contact trench 79 and from above the contact level dielectric layer 280, for example, by an isotropic etch. Each remaining portion of the deposited metallic material in the first lateral recesses 143 constitutes a first electrically conductive layer 146. Each remaining portion of the deposited metallic material in the second lateral recesses 243 constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of one or more bottom most first electrically conductive layers 146 (e.g., located at each level of the optional pedestal channel portion 11 or annular dielectric spacers) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

The electrically conductive layers (146, 246) are formed in the lateral recesses (143, 242) by depositing the electrically conductive material. At least one modified alternating stack (132, 146, 232, 246) including alternating layers of the insulating layers (132, 232) of the at least one initial alternating stack (132, 142, 232, 242) and respective electrically conductive layers (146, 246) is formed around the spacer dielectric portions (142', 242'). The spacer dielectric portions (142', 242') are formed within the through-memory-level via region 500 that is laterally surrounded by the memory stack structures 55.

Each of the memory stack structures 55 comprises a vertical stack of memory elements located at each level of the electrically conductive layers (146, 246). A subset of the electrically conductive layers (146, 246) can comprise word lines for the memory elements. In one embodiment, the semiconductor devices in the underlying peripheral device region 700 can comprise word line switch devices configured to control a bias voltage to respective word lines. The memory-level assembly is located over the semiconductor substrate 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) can comprise staircase regions that include terraces in which each underlying electrically conductive layer (146, 246) extends farther along the first horizontal direction hd1 than any overlying electrically conductive layer (146, 246) in the memory-level assembly (e.g., as shown in FIG. 11B to be described below).

Figure 8A:
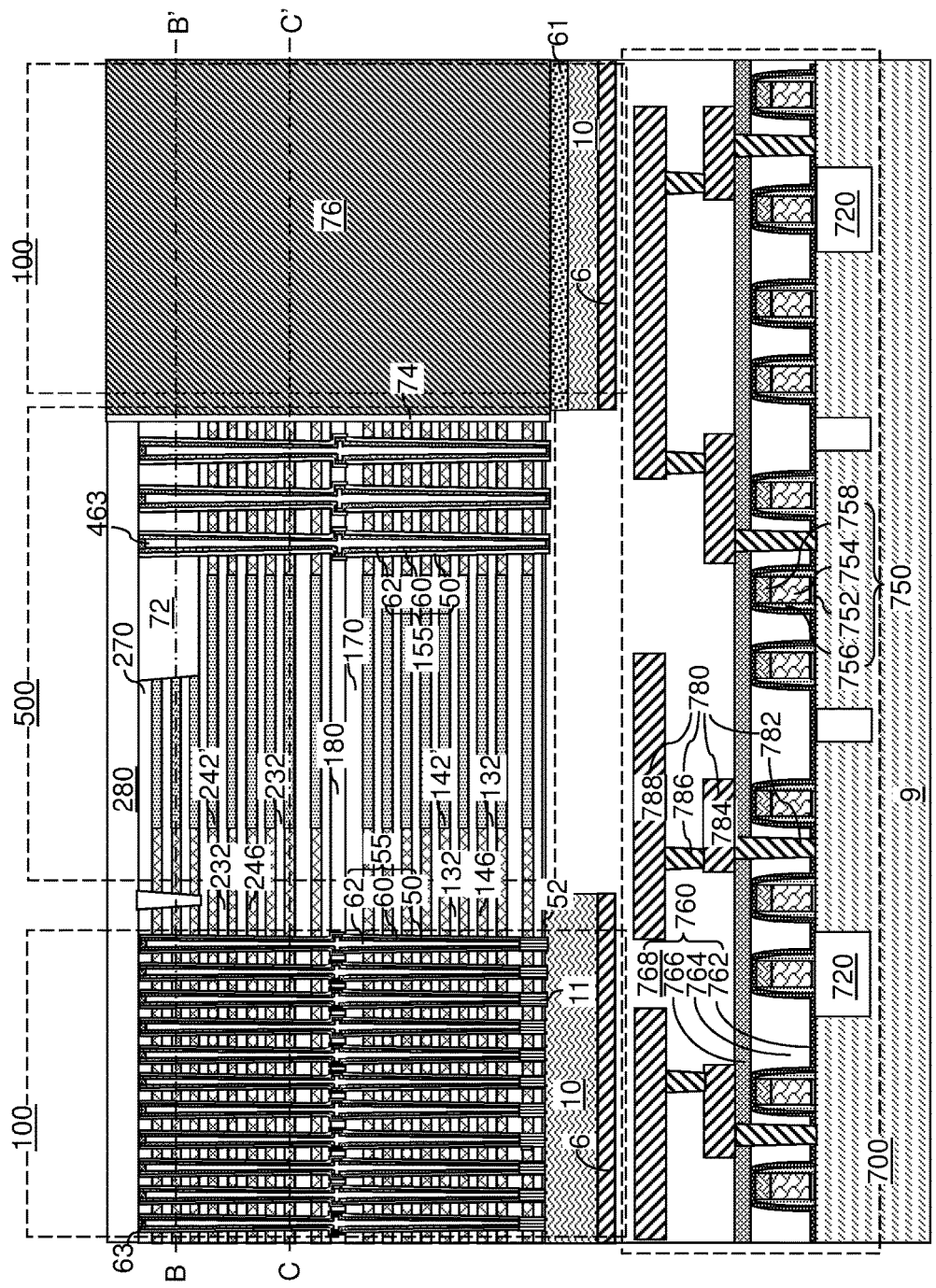
FIG. 8A is a vertical cross-sectional view of the exemplary structure after formation of insulating spacers and backside contact structures according to an embodiment of the present disclosure.
Figure 8B:
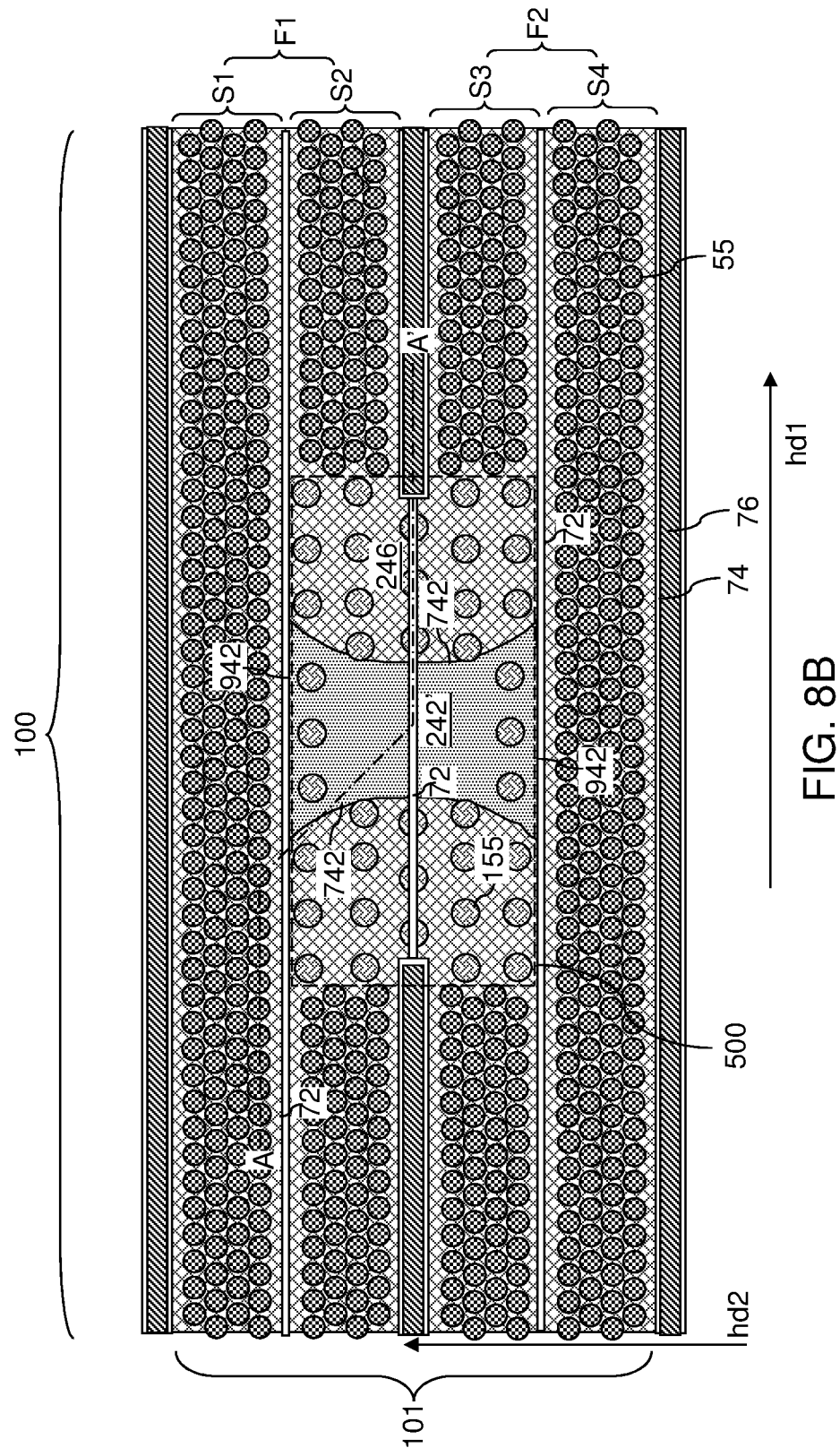
FIG. 8B is a horizontal cross-sectional view of the exemplary structure along the horizontal plane B-B' in FIG. 8A. The zig-zag vertical plane A-A' corresponds to the plane of the vertical cross-sectional view of FIG. 8A.
Figure 8C:
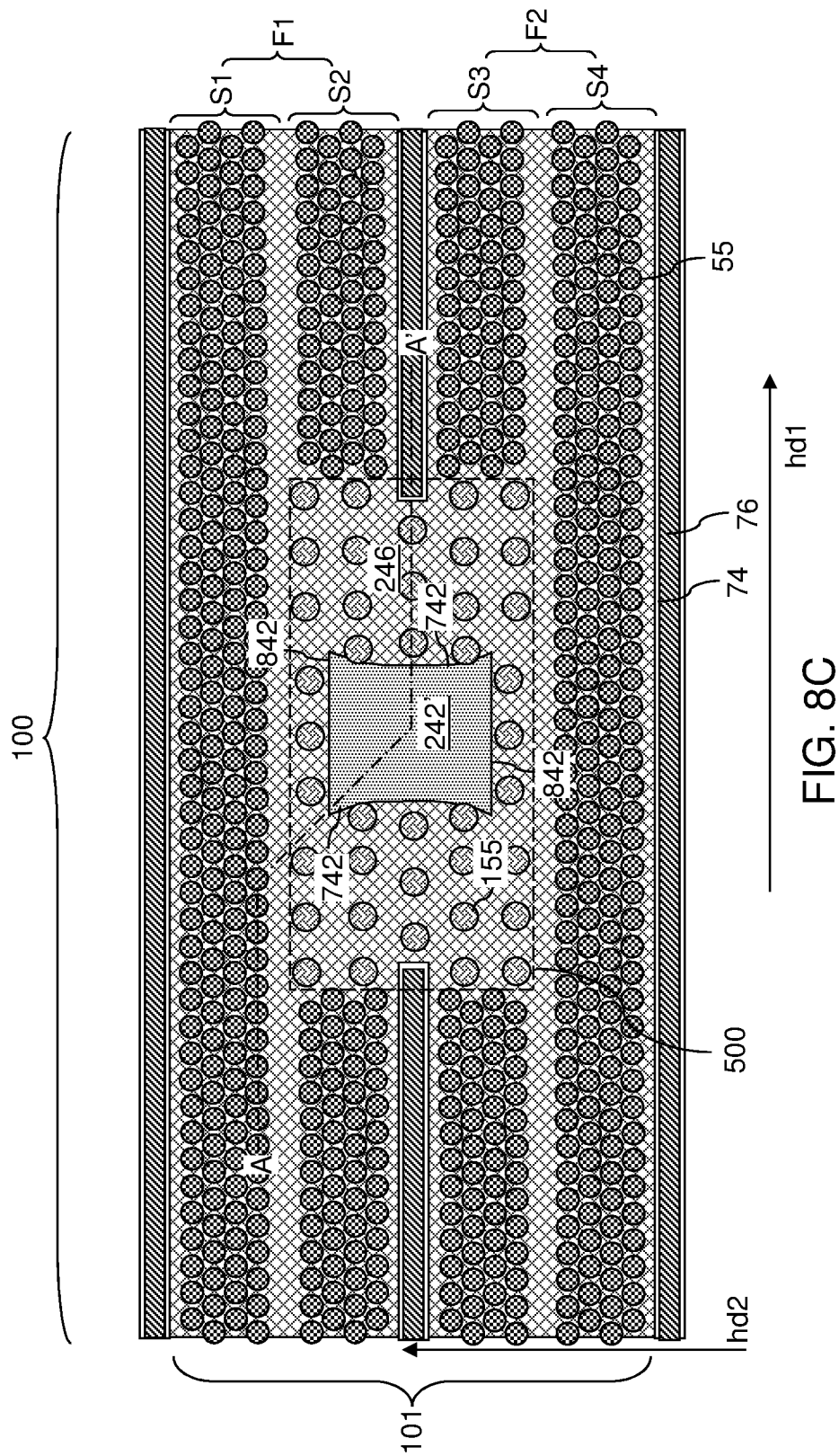
FIG. 8C is a horizontal cross-sectional view of the exemplary structure along the horizontal plane C-C' in FIG. 8A. The zig-zag vertical plane A-A' corresponds to the plane of the vertical cross-sectional view of FIG. 8A.

Referring to FIGS. 8A-8C, dopants of a second conductivity type, which is the opposite of the first conductivity type of the planar semiconductor material layer 10, can be implanted into a surface portion of the substrate semiconductor layer 10 to form a source region 61 underneath the bottom surface of each contact trench 79.

An insulating spacer 74 including a dielectric material can be formed at the periphery of each contact trench 79. A conformal insulating material layer can be deposited in the contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74. The contact level dielectric layer 280 may be thinned due to a collateral etch during the anisotropic etch that removes the vertical portions of horizontal portions of the deposited conformal insulating material.

A backside contact via structure can be formed in the remaining volume of each contact trench 79, for example, by deposition of at least one conductive material and removal of excess portions of the deposited at least one conductive material from above a horizontal plane including the top surface of the contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the contact trenches 79 and removing the deposited doped semiconductor material from upper portions of the contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the contact level dielectric layer 280. The contact level dielectric layer 280 can be thinned and removed during a latter part of the planarization process, which may employ chemical mechanical planarization (CMP), a recess etch, or a combination thereof. Each laterally-elongated contact via structure 76 (e.g., a source electrode or local interconnect) can be formed through the memory-level assembly and on a respective source region 61. The top surface of each laterally-elongated contact via structure 76 can located above a horizontal plane including the top surfaces of the memory stack structures 55.

Figure 9A:
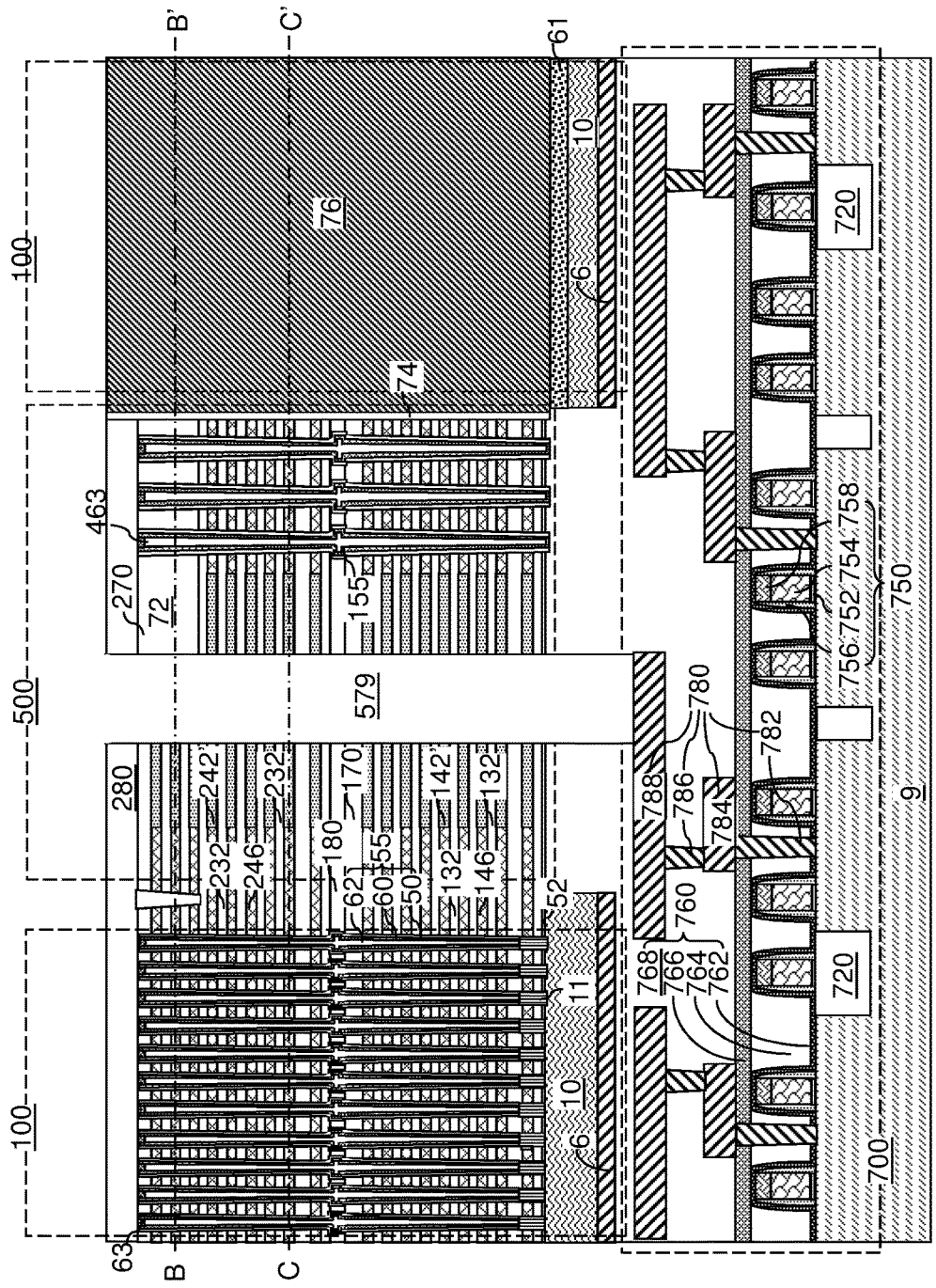
FIG. 9A is a vertical cross-sectional view of the exemplary structure after formation of a through-memory-level via cavity according to an embodiment of the present disclosure.
Figure 9B:
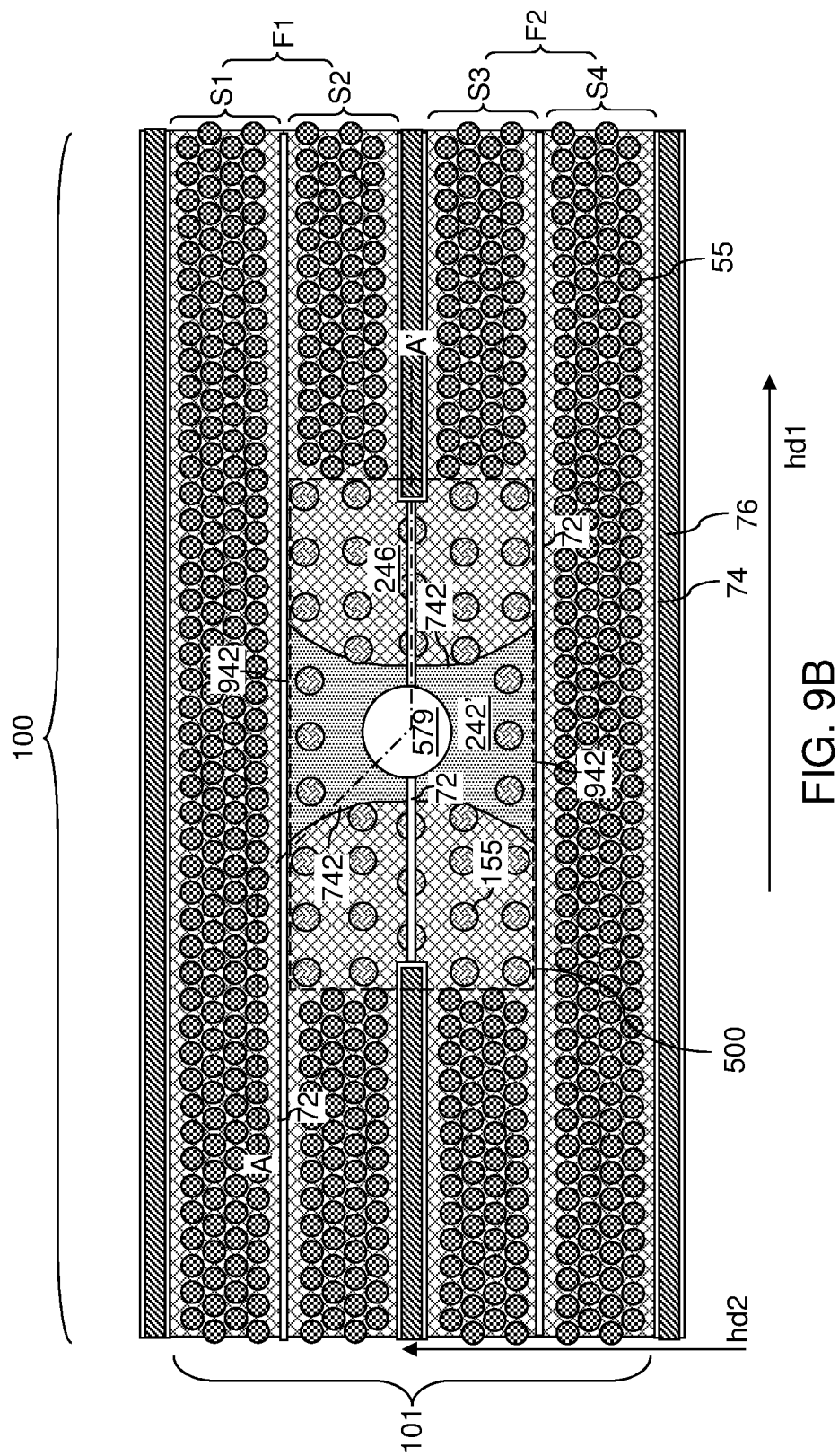
FIG. 9B is a horizontal cross-sectional view of the exemplary structure along the horizontal plane B-B' in FIG. 9A. The zig-zag vertical plane A-A' corresponds to the plane of the vertical cross-sectional view of FIG. 9A.
Figure 9C:
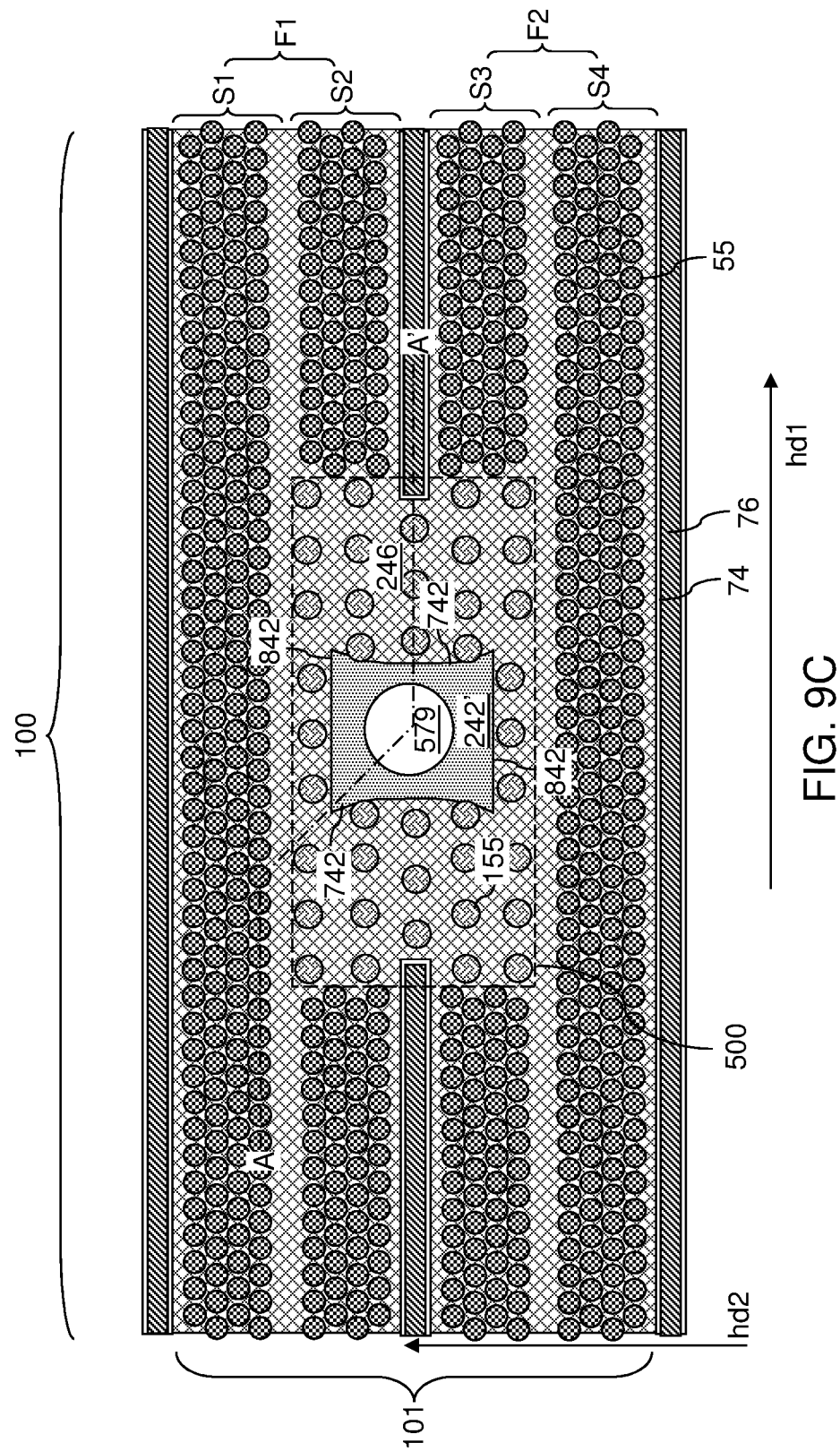
FIG. 9C is a horizontal cross-sectional view of the exemplary structure along the horizontal plane C-C' in FIG. 9A. The zig-zag vertical plane A-A' corresponds to the plane of the vertical cross-sectional view of FIG. 9A.

Referring to FIGS. 9A-9C, at least one through-memory-level via cavity 579 can be formed in each through-memory-level via region 500 through an alternating stack of the spacer dielectric portions (142', 242') and the insulating layers (132, 232). The through-memory-level via cavities 579 can be formed, for example, by applying a photoresist layer (not shown) over the contact level dielectric layer 280, lithographically patterning the photoresist layer to form at least one opening over each through-memory-level via region 500, and anisotropically etching the portions of the contact level dielectric layers 280 and the memory-level assembly that underlie the openings in the photoresist layer.

The through-memory-level via cavities 579 can extend through the entirety of the memory-level assembly, opening (s) in the planar semiconductor material layer 10 and the optional planar conductive material layer 6, and into the at least one lower level dielectric material layer 760. In one embodiment, a topmost surface of the lower level metal interconnect structures 780 may be physically exposed in the through-memory-level via cavities 579. In one embodiment, the through-memory-level via cavities 579 can comprise substantially vertical sidewalls that extend through the memory-level assembly and an upper portion of the at least one lower level dielectric material layer 760. As used herein, a sidewall is "substantially vertical" if the sidewall is vertical or deviates from a vertical plane by an angle less than 5 degrees.

Figure 10A:
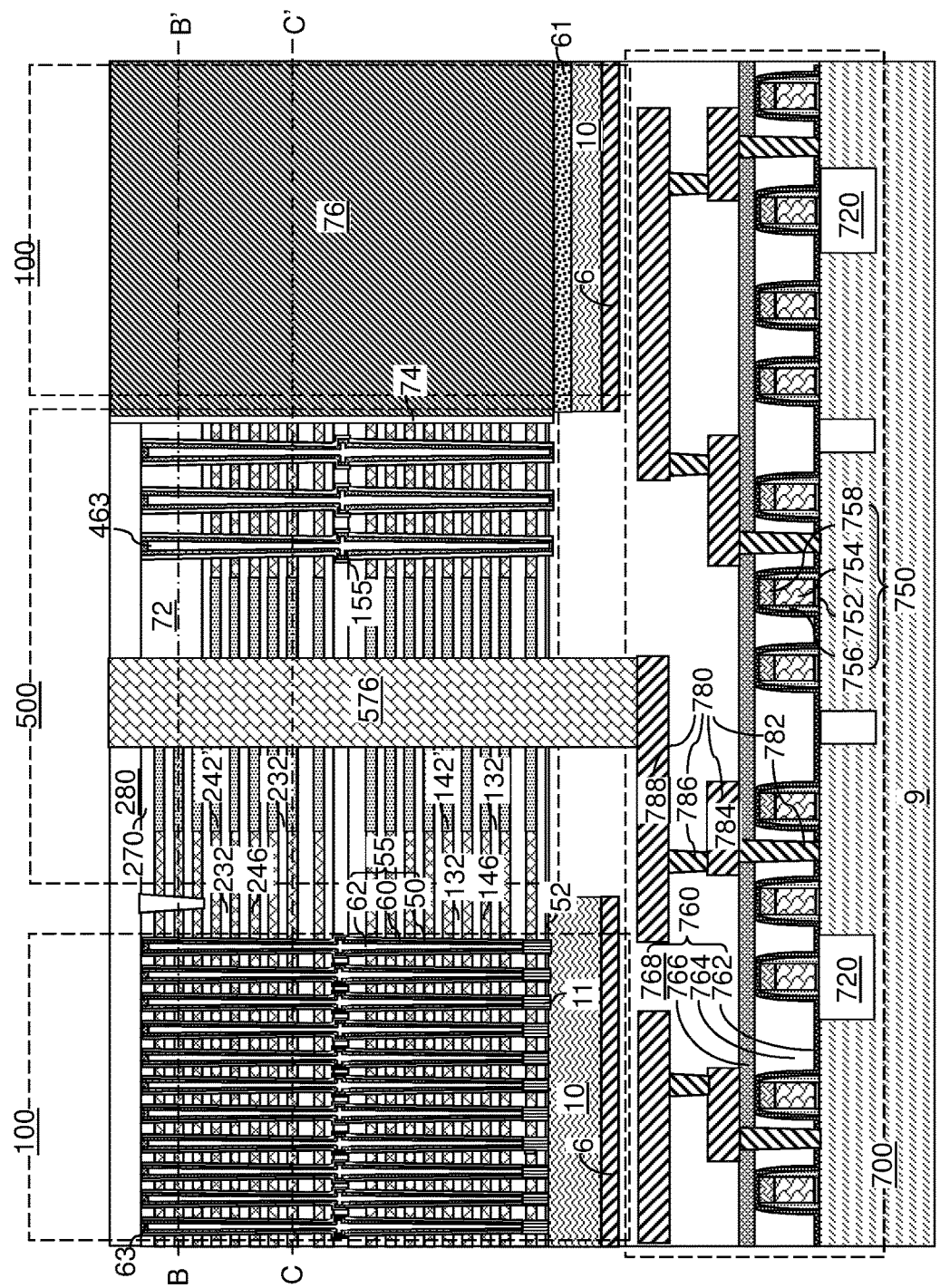
FIG. 10A is a vertical cross-sectional view of the exemplary structure after formation of a through-memory-level via structure according to an embodiment of the present disclosure.
Figure 10B:
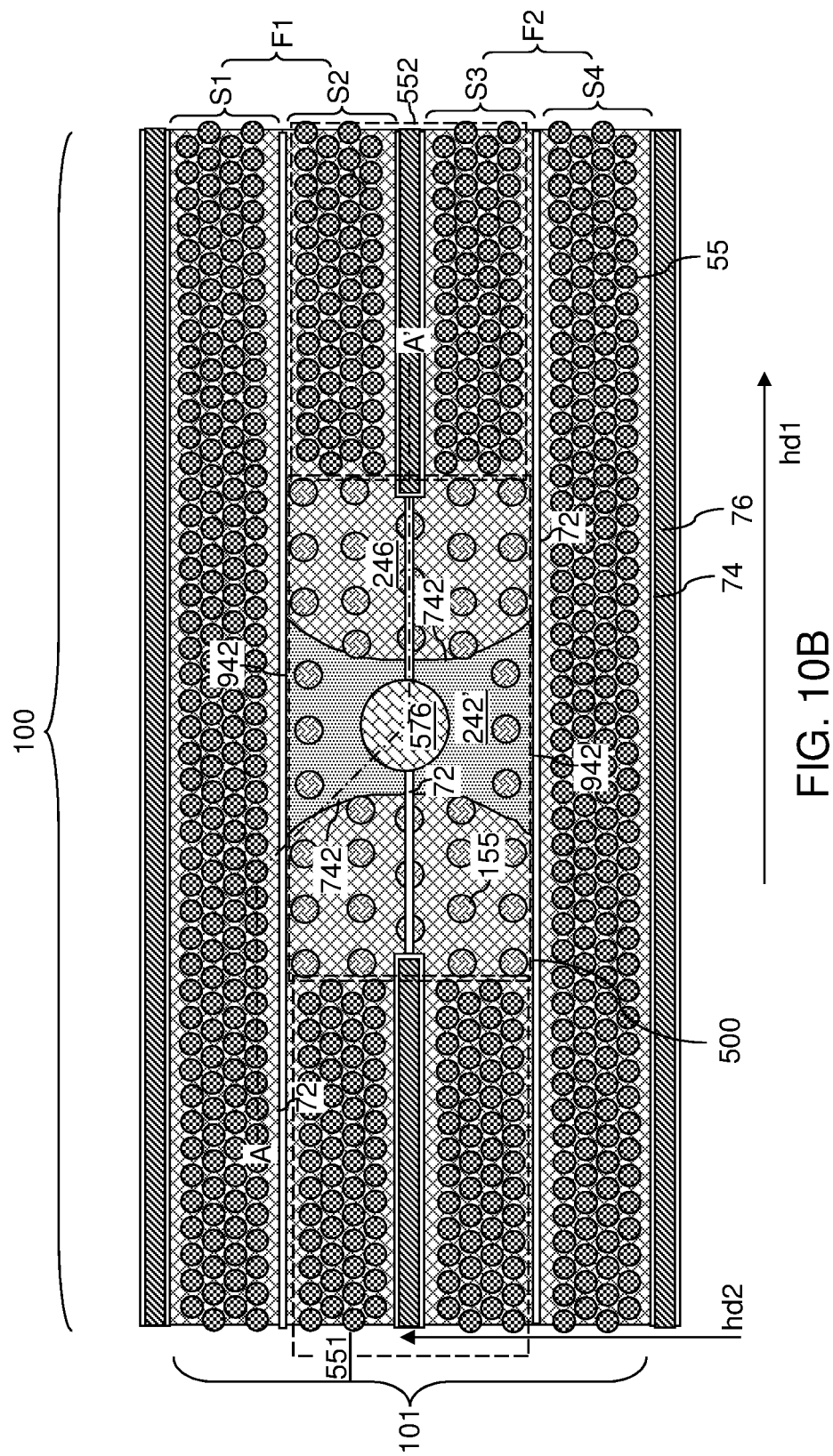
FIG. 10B is a horizontal cross-sectional view of the exemplary structure along the horizontal plane B-B' in FIG. 10A. The zig-zag vertical plane A-A' corresponds to the plane of the vertical cross-sectional view of FIG. 10A.

Referring to FIGS. 10A-10C, at least one conductive material is deposited in each through-memory-level via cavities 579, and excess portions of the at least one conductive material is removed from above the top surface of the contact level dielectric layer 280. The remaining portions of the at least one conductive material constitutes at least one through-memory-level via structure 576 that contacts an underlying lower level metal interconnect structure 780 (such as a lower level topmost metal structures 788). Each of the at least one through-memory-level via structure 576 can be formed through each of the spacer dielectric portions (142', 242') and each of the insulating layers (132, 232) within the at least one alternating stack (132, 142', 232, 242') in the through-memory-level via region 500. Each of the at least one through-memory-level via structure 576 vertically extends at least from a first horizontal plane including a topmost surface of the memory-level assembly to a second horizontal plane including a bottommost surface of the memory-level assembly. Each sidewall of the at least one through-memory-level via structure 576 can be laterally spaced from the electrically conductive layers (146, 246) by a region of the spacer dielectric portions (142', 242'). Thus, structure 576 does not electrically short the electrically conductive layers (146, 246) because structure 576 is surrounded by dielectric (i.e., electrically insulating) layers (132, 142', 232, 242').

While the present disclosure describes an embodiment in which the through-memory-level via structures 576 and the laterally-elongated contact via structures 76 are sequentially formed, embodiments are expressly contemplated herein in which the through-memory-level via structures 576 and the laterally-elongated contact via structures 76 are simultaneously formed, for example, by patterning the through-memory-level via cavities 579 employing a combination of lithographic methods and an anisotropic etch prior to depositing the conductive material(s) of the through-memory-level via structures 576 and the laterally-elongated contact via structures 76.

Referring to FIGS. 11A and 11B, various contact via structures can be formed through the contact level dielectric layer 280 and underlying dielectric materials on various nodes of the memory device in the memory-level assembly and on the lower level metal interconnect structures 780. For example, word line contact via structures 86 can be formed through the contact level dielectric layer 280 and at least one retro-stepped dielectric material portion (165, 265), as shown in FIG. 11B. A subset of the word line contact via structures 86 contacting the second electrically conductive layers 246 extends through the second-tier retro-stepped dielectric material portion 265, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165. Drain contact via structures 88 contacting the drain regions 63 can extend through the contact level dielectric layer 280 and the second insulating cap layer 270. Each via structure (576, 86, 88) may be formed employing a respective set of patterning processes and fill processes. Alternatively, two or more types of via structures (576, 86, 88) may be formed employing a common set of patterning processes and fill processes provided that the anisotropic etch process therein can control vertical extent of cavities at target height levels for each type of cavities that are simultaneously formed. In one embodiment, the word line contact via structures 86 can be formed through the at least one retro-stepped dielectric material portion (165, 265) in each staircase region.

A line level dielectric layer 110 can be formed over the contact level dielectric layer 280. Various metal interconnect structures (103, 106, 107, 108) can be formed in the line level dielectric layer 110. The metal interconnect structures (103, 106, 107, 108) can include upper level metal line structures 108 that are formed on respective through-memory-level via structures 576, bit lines 103 that extend along the second horizontal direction hd2 and perpendicular to the first horizontal direction hd1, word line connection lines 106 that contact word line contact via structures 86, and source line structures 107 that extend in the second horizontal direction hd2 and which provide electrically conductive paths for biasing the source regions 61 through the laterally-elongated contact via structures 76. In one embodiment, the upper level metal interconnect structures 108 may comprise a source shunt line or a power strap that contact the through-memory-level via structure 576. A source shunt line may be a shunt line which extends parallel to and between the bit lines 103. A power strap may be any conductive line which connects the driver circuits to an external power source.

Figure 12:
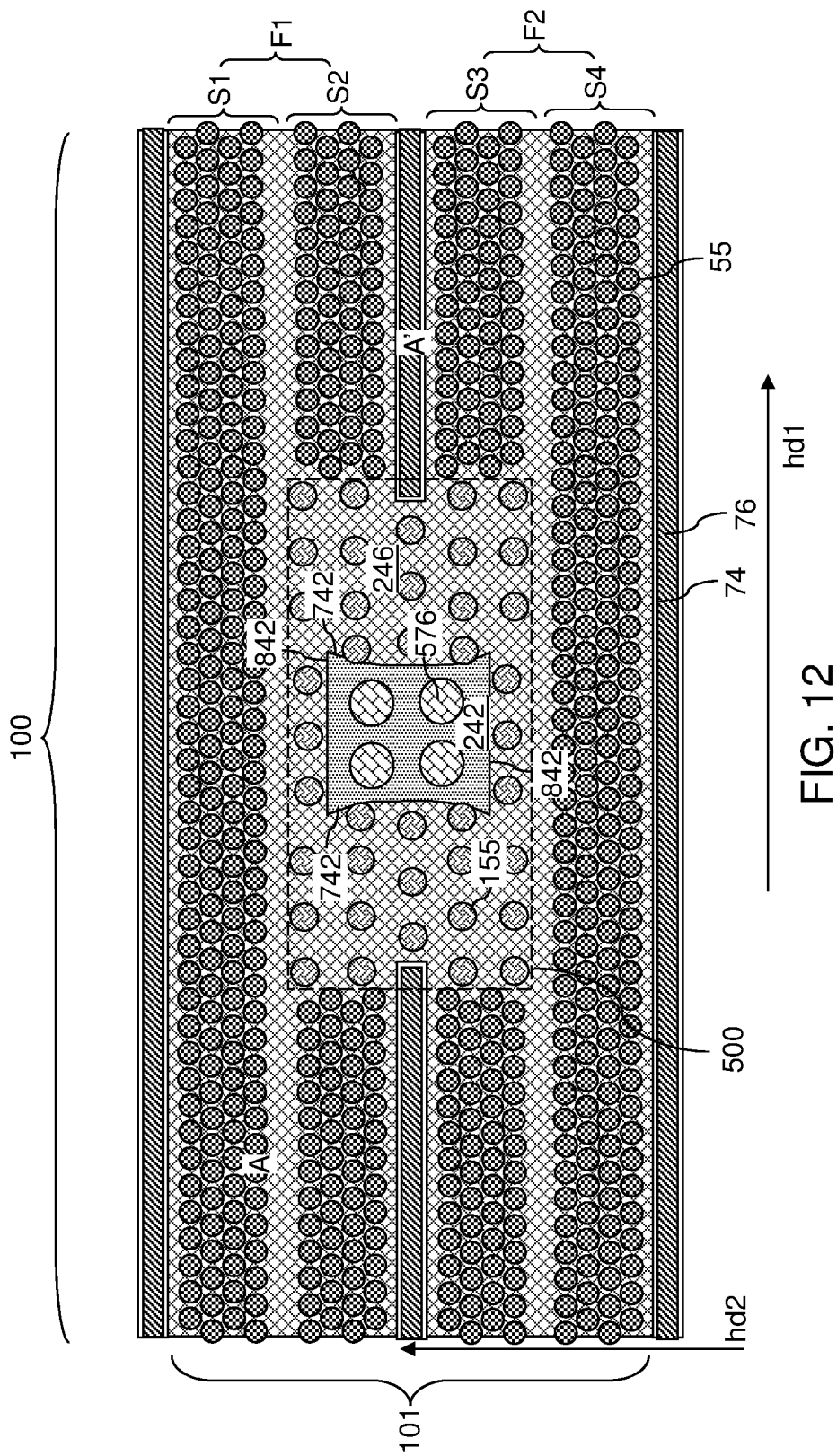
FIG. 12 is a horizontal cross-sectional view of an alternate embodiment of the exemplary structure employing a plurality of through-memory-level via structures within a single through-memory-level via region.

Referring to FIG. 12, an alternate embodiment of the exemplary structure is shown in a horizontal cross-sectional view at the level of the horizontal cross-sectional view of FIG. 10C. In this embodiment, instead of a single structure 576, a plurality of through-memory-level via structures 576 can be formed within a single alternating stack of spacer dielectric portions (142', 242') and electrically insulating layers (132, 232).

Figure 13A:
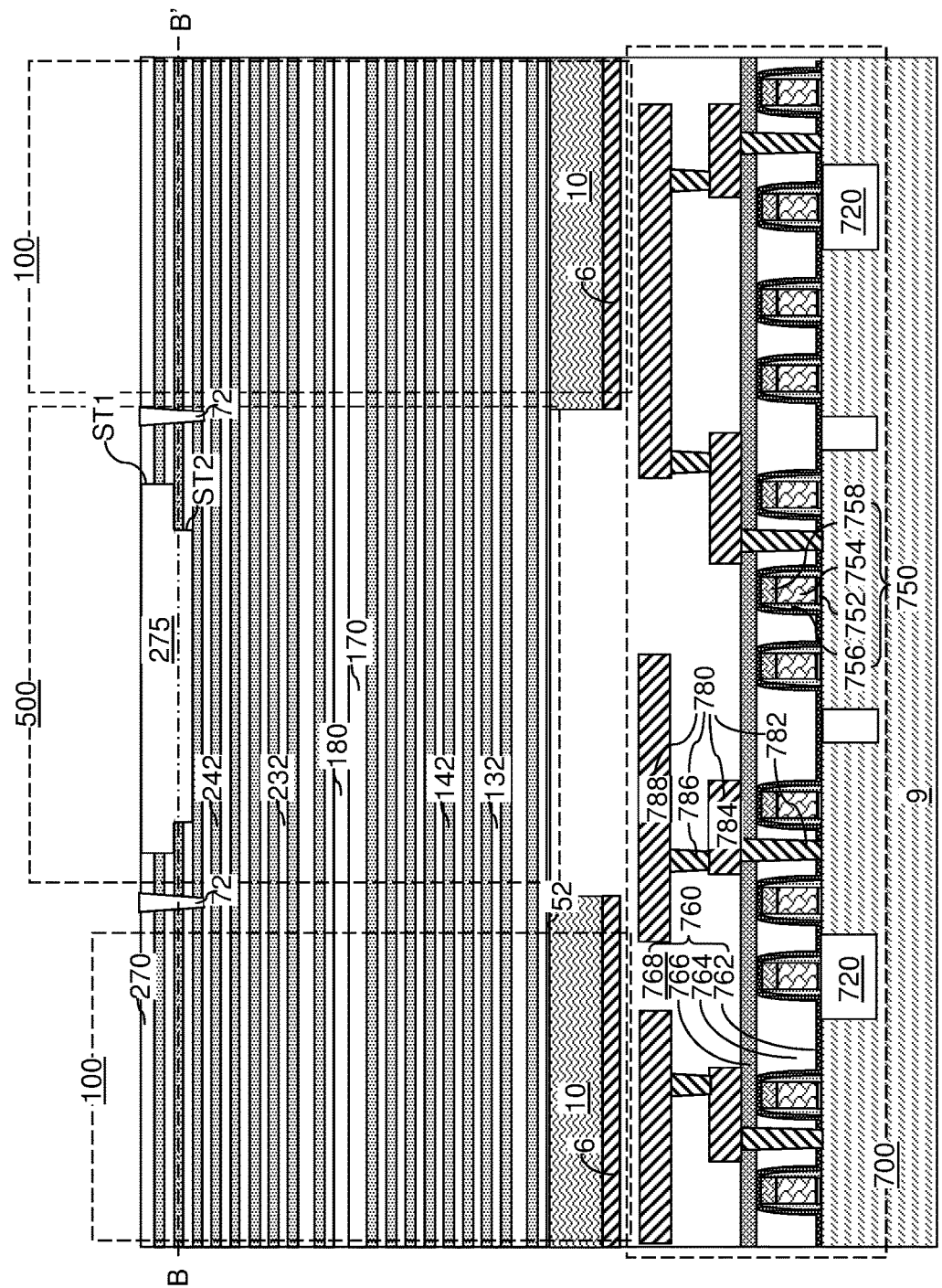
FIG. 13A is a vertical cross-sectional view of a modification of the exemplary structure according to an embodiment of the present disclosure.
Figure 13B:
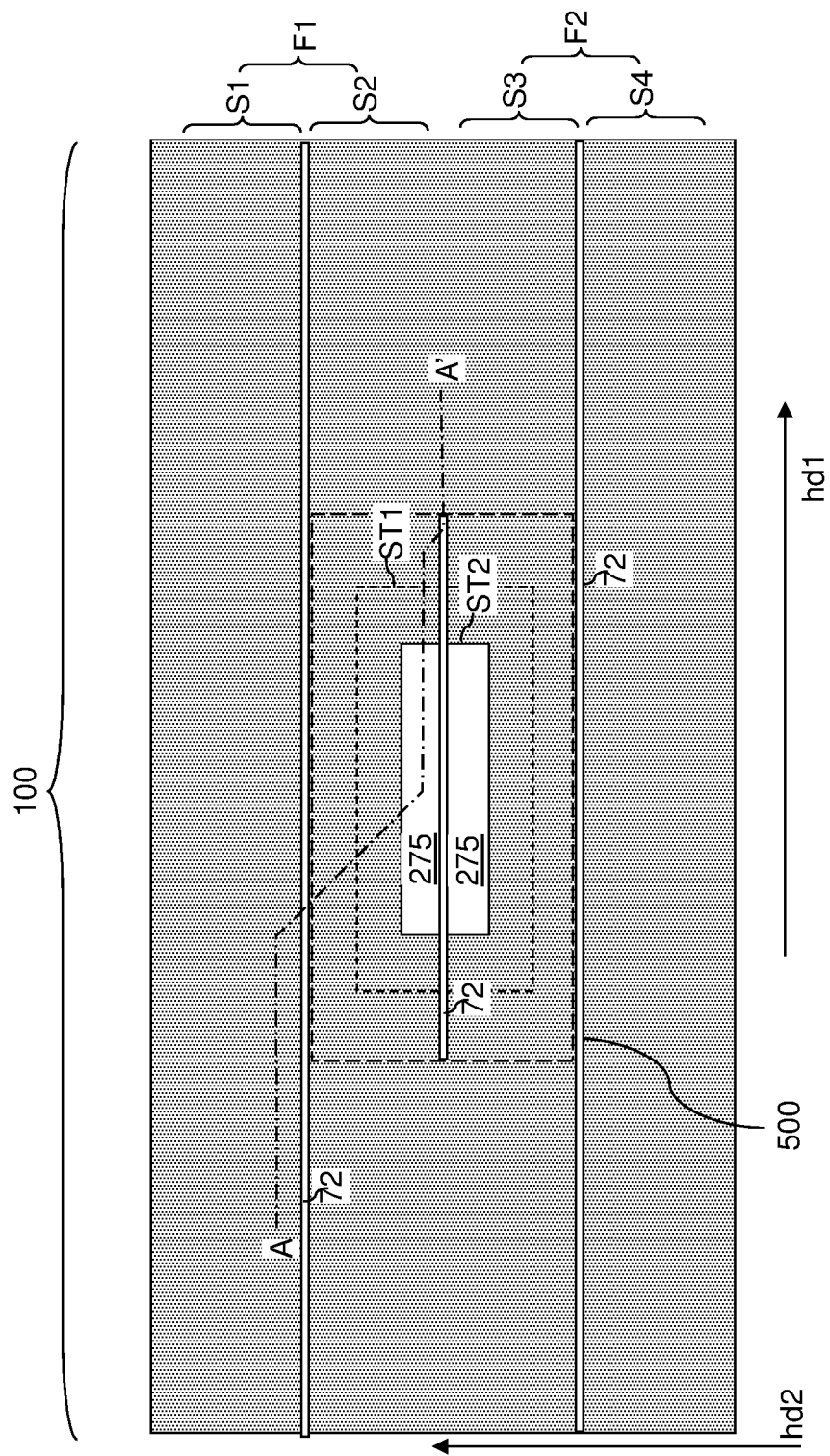
FIG. 13B is a horizontal cross-sectional view of the modification of the exemplary structure along the horizontal plane B-B' in FIG. 13A. The zig-zag vertical plane A-A' corresponds to the plane of the vertical cross-sectional view of FIG. 13A.
Figure 14A:
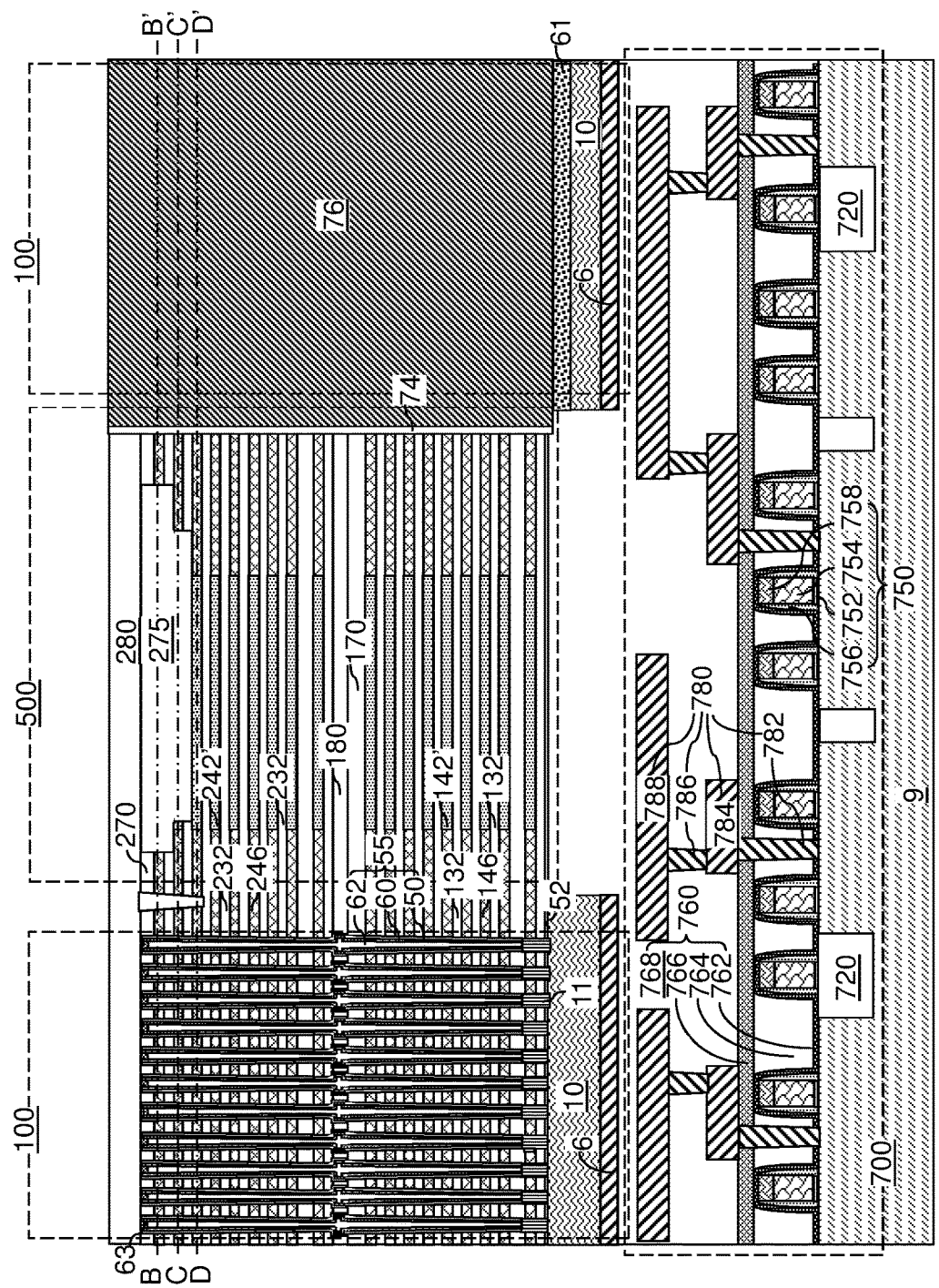
FIG. 14A is a vertical cross-sectional view of the modification of the exemplary structure after formation of laterally-extending contact via structures according to an embodiment of the present disclosure.
Figure 14B:
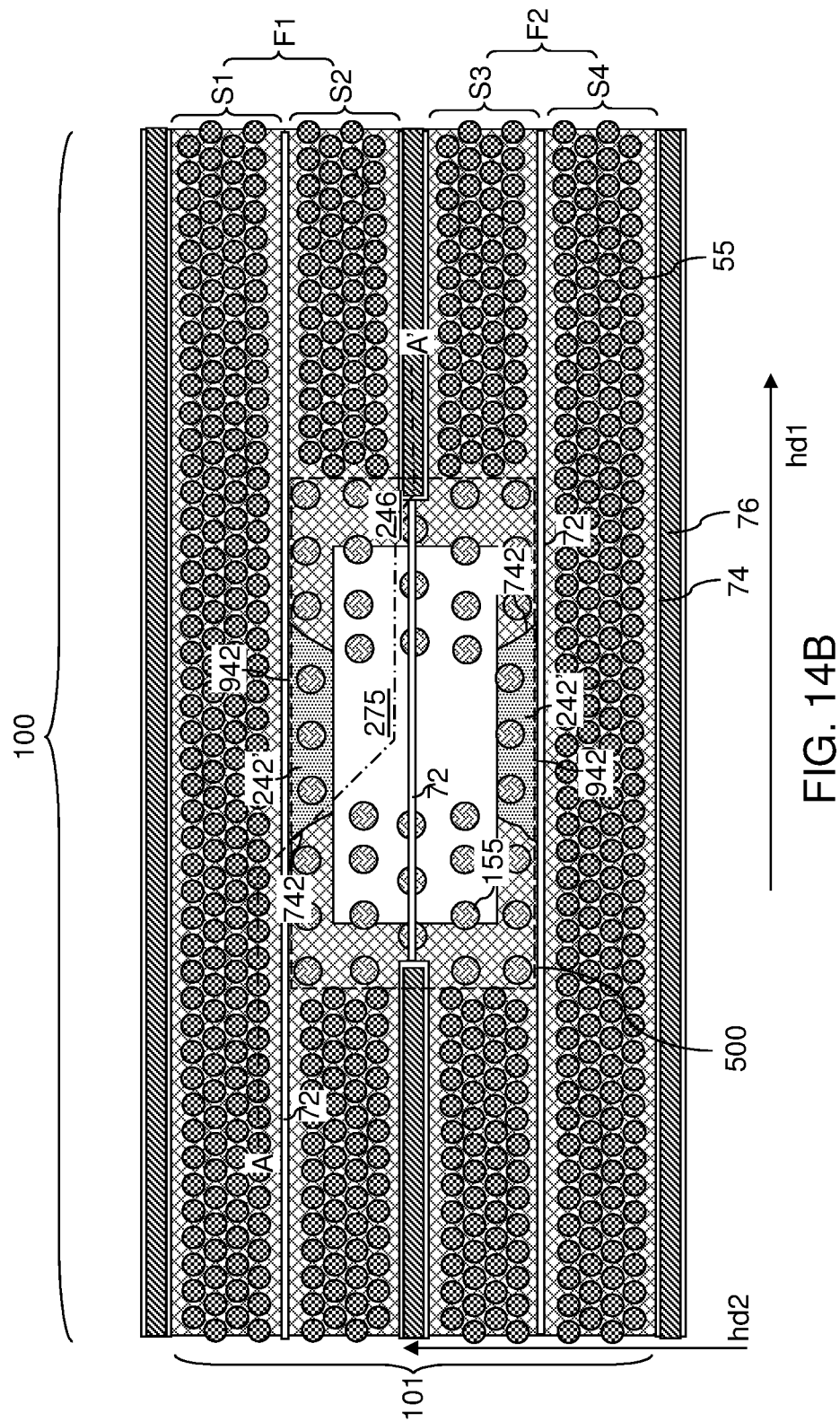
FIG. 14B is a horizontal cross-sectional view of the modification of the exemplary structure along the horizontal plane B-B' in FIG. 14A. The zig-zag vertical plane A-A' corresponds to the plane of the vertical cross-sectional view of FIG. 14A.
Figure 14C:
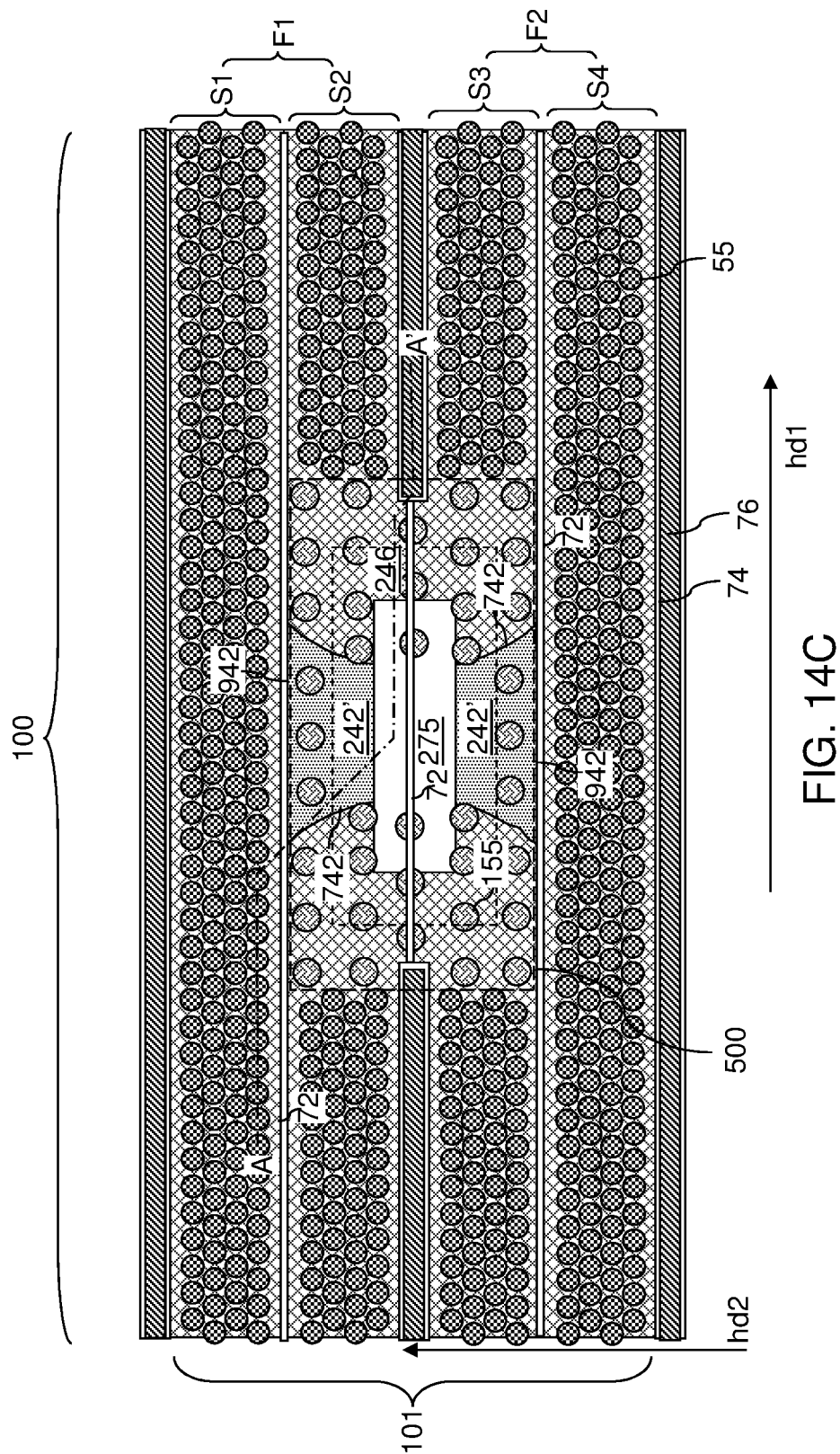
FIG. 14C is a horizontal cross-sectional view of the modification of the exemplary structure along the horizontal plane C-C' in FIG. 14A. The zig-zag vertical plane A-A' corresponds to the plane of the vertical cross-sectional view of FIG. 14A.
Figure 14D:
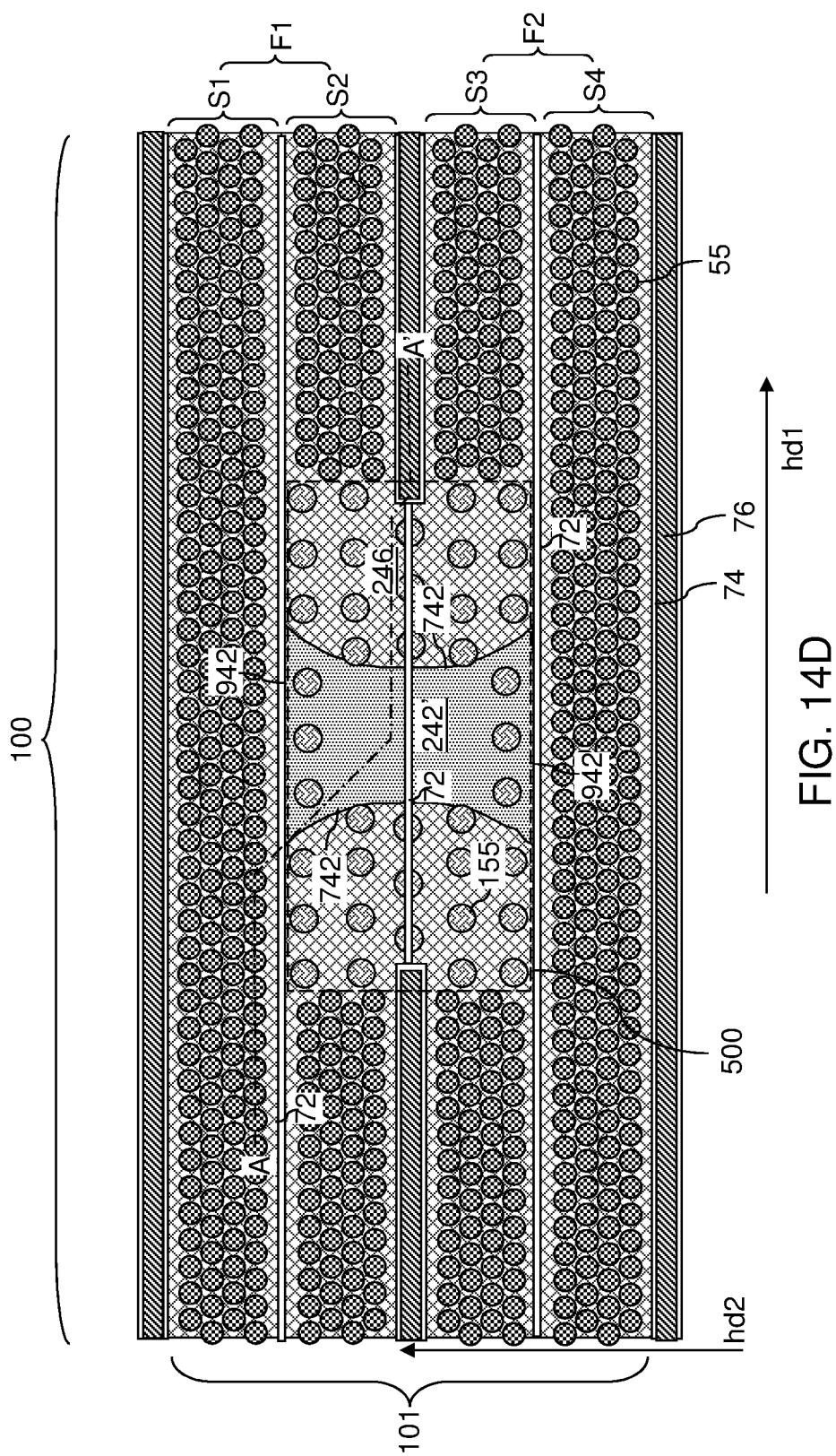
FIG. 14D is a horizontal cross-sectional view of the modification of the exemplary structure along the horizontal plane D-D' in FIG. 14A. The zig-zag vertical plane A-A' corresponds to the plane of the vertical cross-sectional view of FIG. 14A.

FIGS. 13A and 13B illustrate another alternative embodiment of the exemplary structure. The structure illustrated in FIGS. 13A and 13B can be derived from the exemplary structure of FIGS. 2A and 2B by performing the processing steps of FIG. 3 for forming the second-tier alternating stack (232, 242), and by forming stepped surfaces within the through-memory-level via region 500 at a processing step after formation of drain-select-level dielectric material portion 275. The number of vertical steps (ST1, ST2) can be one less than the total number of drain select gate electrodes to be subsequently formed. The location of a first vertical step ST1 is illustrated in FIG. 13B as a dotted shape. While the present disclosure is described employing an embodiment in which a subsequently formed vertical step (such as a second vertical step ST2) is nested within a pre-existing vertical step (such as a first vertical step ST1), any configuration of the vertical steps can be employed provided that each of the sacrificial material layers 242 at the levels of the drain select gate electrode is provided with stepped surfaces on both peripheral regions of the through-memory-level via region 500 that are laterally spaced apart along the first horizontal direction hd1. The steps do not extend to the word lines (146, 246) and source select gate electrodes (146) which underlie the drain select gate electrodes.

While the present disclosure is described for an embodiment in which multiple levels of drain select gate electrodes and at least one vertical step (ST1, ST2) is employed, embodiments are expressly contemplated herein in which only a single level is employed for drain select gate electrodes. In this case, the drain-select-level shallow trench isolation structure 72 can extend only through a topmost layer among the second electrically conductive layers 246, and formation of at least one vertical step (ST1, ST2) is not needed. In addition, while the present disclosure is described employing an embodiment in which more than one tier structure is employed, embodiments are expressly contemplated herein in which only a single tier structure is employed.

Referring to FIGS. 14A-14D, the remaining processing steps of FIG. 3 and additional processing steps FIGS. 4A to 8C can be performed to form the insulating spacers 74 and the laterally-extending contact via structures 76. At least one of the support pillar structures 155 can be formed through the drain-select-level dielectric material portion 275. At this processing step, the electrically conductive layers (i.e., a subset of the second electrically conductive layers 246) that are located at the levels of the drain-select-level shallow trench isolation structures 72 can be structurally divided into multiple physically disjoined portions in the first horizontal direction hd1 due to the presence of the second spacer dielectric portions 242', the drain-select-level shallow trench isolation structures 72, and the drain-select-level dielectric material portion 275 within, or around, the through-memory-level via region 500.

In one embodiment, the placement of the stepped word line contact via regions 200 shown in FIG. 11B along consecutive blocks 101 in the second horizontal direction hd2 can alternate between two opposite sides (e.g., left and right sides shown in the Figures) of region 100. In this embodiment, the drain-select-level shallow trench isolation structures 72 and the drain-select-level dielectric material portion 275 in region 500 interrupt the electrical continuity of the drain select gate electrodes 246 between portions of the memory array region 100 located within the same strip and separated by the through-memory-level via region 500, resulting in laterally disjoined portions of the drain select gate electrodes. Therefore, electrical connection between laterally disjoined portions of each second electrically conductive layer 246 located at the levels of the drain select gate electrodes can be restored by providing metal interconnect structures that electrically connect the respective physically disjoined portions of the second electrically conductive layer 246 located at the same level. Such metal interconnect structures are herein referred to as drain select interconnect structures.

Figure 15A:
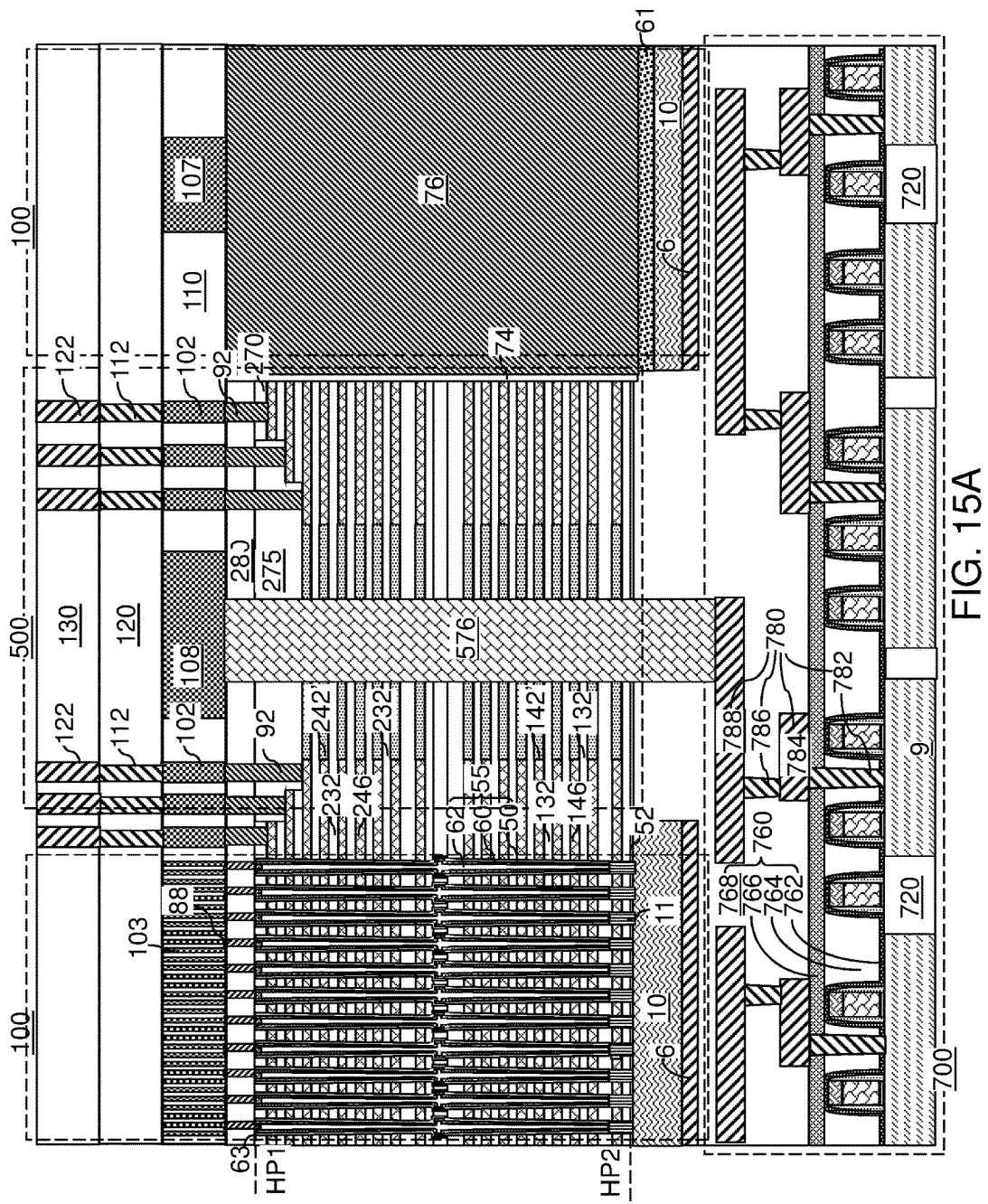
FIG. 15A is a vertical cross-sectional view of the modification of the modification of the exemplary structure after formation of drain select interconnect structures according to an embodiment of the present disclosure.
Figure 15B:
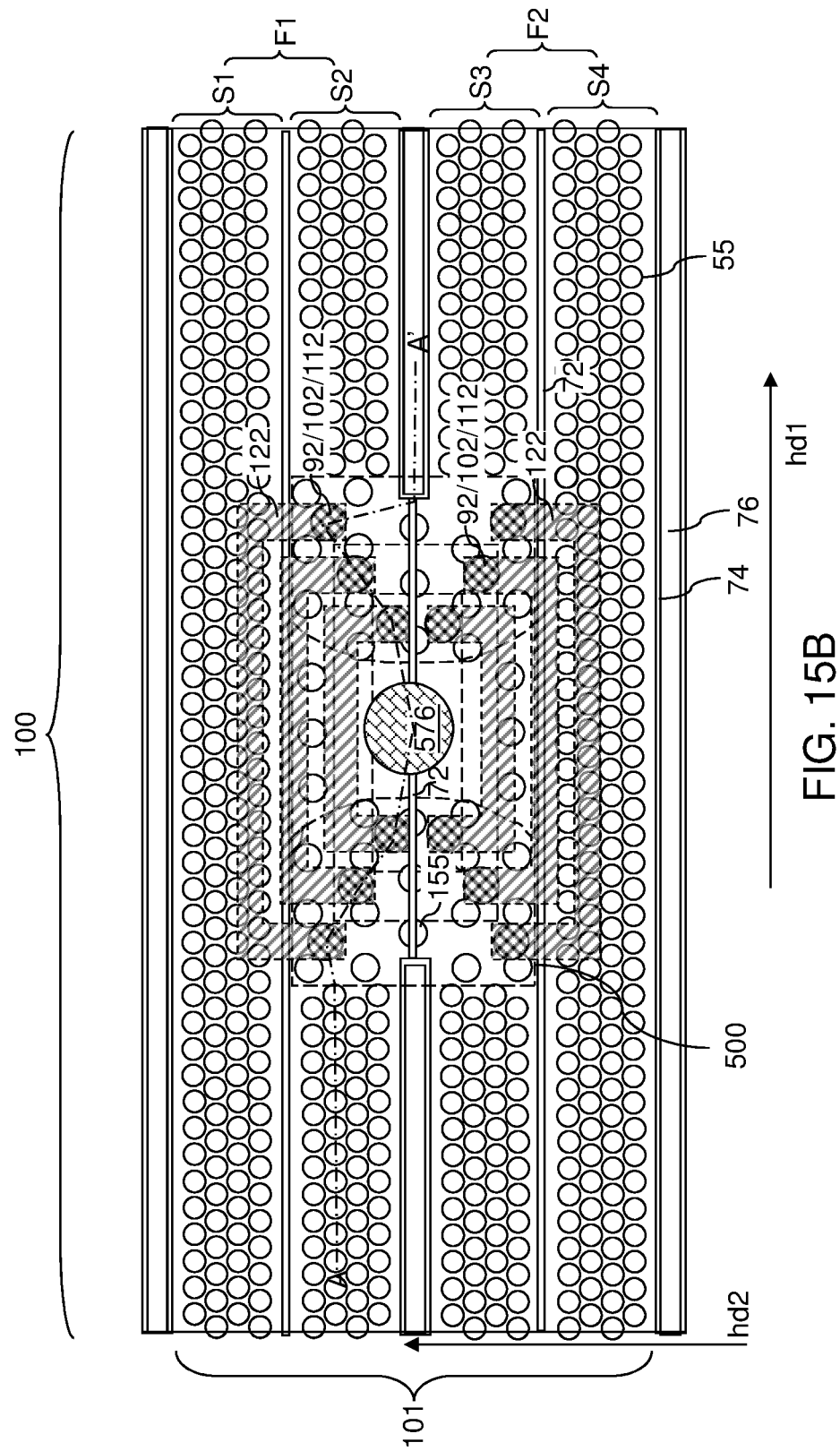
FIG. 15B is a see-through plan view of the modification of the exemplary structure of FIG. 15A. The zig-zag vertical plane A-A' corresponds to the plane of the vertical cross-sectional view of FIG. 15A.

Referring to FIGS. 15A and 15B, an example of drain select interconnect structures (92, 102, 112, 122) is illustrated. The various components of the drain select interconnect structures (92, 102, 112, 122) (such as drain select level contact via structures 92 and drain select first line structures 102) may be formed concurrently with formation of various contact via structures (88, 86) and/or formation of the metal interconnect structures (108, 103, 106, 107) in the line level dielectric layer 110 and in structure 275. Additional components (112, 122) of the drain select interconnect structures (92, 102, 112, 122), such as first-via-level via structures 112 and second-line-level line structures 122, can be formed above the level of the bit lines 103, and can be embedded in respective interlayer dielectric (ILD) layers such as a first via level dielectric layer 120 and a second line level dielectric layer 130. In an alternative embodiment, interconnect structures 108 may be located in the first via level dielectric layer 120 and/or in the second line level dielectric layer 130, while the second-line-level line structures 122 can be formed in line level dielectric layer 110 and/or in the structure 275 below the interconnect structures 108.

The exemplary structures of the embodiments of the present disclosure include a semiconductor structure that comprises: a memory-level assembly located over a substrate 9 and including at least one alternating stack (132, 146, 232, 246) and memory stack structures 55 vertically extending through the at least one alternating stack (132, 146, 232, 246), wherein each of the at least one an alternating stack (132, 146, 232, 246) includes alternating layers of respective insulating layers (132 or 232) and respective electrically conductive layers (146 or 246), and each of the electrically conductive layers (146, 246) in the at least one alternating stack (132, 146, 232, 246) includes a respective opening such that a periphery of a respective spacer dielectric portion (142' or 242') located in the opening contacts a sidewall of the respective electrically conductive layers (146 or 246). The semiconductor structure further comprises at least one through-memory-level via structure 576 that vertically extends through each of the spacer dielectric portions (142', 242') and the insulating layers (132, 232) and at least from a first horizontal plane HP1 (See FIGS. 11A and 11B) including a topmost surface of the memory-level assembly to a second horizontal plane HP2 (See FIGS. 11A and 11B) including a bottommost surface of the memory-level assembly.

In one embodiment, each of the memory stack structures 55 passes through electrically conductive layers (146, 246), and does not pass through any of the spacer dielectric portions (142', 242'). In one embodiment, the at least one through-memory-level via structure 576 extends through at least one alternating stack of the respective insulating layers (132, 232) and the spacer dielectric portions (142', 242').

In one embodiment, the memory stack structures 55 are laterally spaced from the at least one through-memory-level via structure 576 by a support pillar region (i.e., the area of the through-memory-level via region 500 that includes the support pillar structures 155) that laterally surrounds the spacer dielectric portions (142', 242') and including a plurality of support pillar structures 155. In one embodiment, each of the support pillar structures 155 and each of the memory stack structures 55 comprise a set of material layers including a memory film 50 and a vertical semiconductor layer 60.

In one embodiment, the semiconductor structure can further comprise a plurality of laterally-elongated contact via structures 76 (e.g., the plurality of laterally-elongated contact via structures 76 adjoining the first strip 51 and the fourth strip S4) that vertically extend through the memory-level assembly, laterally extend along a first horizontal direction hd1, and laterally divide the at least one alternating stack into a plurality of laterally spaced-apart blocks. The spacer dielectric portions (142', 242') can be located between a pair of laterally-elongated contact via structures 76. In one embodiment, the memory stack structures 55 comprises a first subset 551 of memory stack structures and a second subset 552 (see FIG. 10B) of memory stack structures that are located between the pair of laterally-elongated contact via structures 76 and spaced apart from each other along the first horizontal direction hd1. The spacer dielectric portions (142', 242') can be located between the first subset 551 of memory stack structures and the second subset 552 of memory stack structures.

A pair of drain-select-level shallow trench isolation structures 72 can extend along the first lengthwise direction hd1, and along with the stack of electrically insulating (i.e., dielectric) layers (232, 242') can divide a drain-select-level electrically conductive layers 246 into three physically disjoined portions. A spacer dielectric portion 242' located at a same level as the pair of drain-select-level shallow trench isolation structures 72 can contact sidewalls of the pair of drain-select-level shallow trench isolation structures 72. In one embodiment, additional spacer dielectric portions (142', 242') that underlie the spacer dielectric portion 242' can have a lesser lateral extent along a second horizontal direction hd2 that is perpendicular to the first horizontal direction hd1 than the spacer dielectric portion 242' located at the same level as the pair of drain-select-level shallow trench isolation structures 72.

In one embodiment, each of the spacer dielectric portions (142', 242') can have a pair of concave sidewalls 742 and a pair of substantially parallel straight sidewalls (842 or 942). The pair of concave sidewalls 742 can face the first horizontal direction hd1. The pair of substantially parallel straight sidewalls (842 or 942) can be parallel to the first horizontal direction hd1. As used herein, a sidewall faces a horizontal direction if all surface normals of the sidewall are at angles less than 45 degrees with respect to the horizontal direction.

In one embodiment, a pair of contact trenches 79 (such as the contact trenches dividing the second strip S2 from the third strip S3) can include a pair of laterally-elongated contact via structures 76, vertically extend through the memory-level assembly, laterally extend along a first horizontal direction hd1, and are substantially co-linear with each other along the first horizontal direction hd1. The spacer dielectric portions (142', 242') are located between the pair of laterally-elongated contact via structures 76 located in the respective trenches 79. In one embodiment, each of the spacer dielectric portions (142', 242') can have a pair of concave sidewalls 742 that are substantially equidistant from a most proximal sidewall of the pair of contact trenches 79 along the first horizontal direction hd1.

In one embodiment, the lower level metal interconnect structure electrically contacts at least one node of the semiconductor devices of the driver circuit located at least partially below the memory-level assembly. The at least one through-memory-level via structure 576 contacts a top surface of the lower level metal interconnect structure 780 underlying the memory-level assembly and a bottom surface of an upper level metal interconnect structure 108 overlying the memory-level assembly.

In one embodiment, two or more topmost layers 246 among the electrically conductive layers (146, 246) are drain select gate electrodes, and each of the drain select gate electrodes is physically divided into multiple portions by the dielectric material portion 275 (and optionally by the spacer dielectric portions 242' depending on the extent of portion 275) around the at least one through-memory-level via structure 576. A stepped region containing the steps ST1, ST2 is located under the dielectric material portion 275. In the stepped region, an underlying drain select electrode 246 extends closer to the at least one through-memory-level via structure than an overlying drain select electrode 246 located above the underlying drain select electrode, as shown in FIG. 15A. The semiconductor structure further comprises drain select interconnect structures (92, 102, 112, 122) which electrically contact the drain select gate electrodes 246 in the stepped region (i.e., which electrically contact the electrodes 246 exposed at the steps ST1 and ST2) and which electrically connect portions of the drain select gate electrodes 246 at respective levels that are separated by the dielectric material portion 275.

Each of the exemplary structures and modifications thereof can include a three-dimensional memory structure. The memory stack structures 55 can comprise memory elements of a vertical NAND device. The electrically conductive layers (146, 246) can comprise, or can be electrically connected to, a respective word line of the vertical NAND device. The semiconductor substrate 9 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising at least one of a word line driver circuit and a bit line driver circuit for the vertical NAND device. The array of monolithic three-dimensional NAND strings can comprise a plurality of semiconductor channels, wherein at least one end portion (such as a vertical semiconductor layer 60) of each of the plurality of semiconductor channels (11, 60) extends substantially perpendicular to a top surface of the semiconductor substrate 9, a plurality of charge storage elements (as embodied as portions of the memory material layer 54 located at each word line level), each charge storage element located adjacent to a respective one of the plurality of semiconductor channels (11, 60), and a plurality of control gate electrodes (as embodied as a subset of the electrically conductive layers (146, 246) having a strip shape extending substantially parallel to the top surface of the semiconductor substrate 9 (e.g., along the first horizontal direction hd1), the plurality of control gate electrodes comprise at least a first control gate electrode located in the first device level and a second control gate electrode located in the second device level.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:
a memory-level assembly located over a substrate and including an alternating stack of insulating layers and composite layers, wherein the insulating layers and the composite layers alternate along a vertical direction that is perpendicular to a top surface of the substrate, wherein each of the composite layers comprises:
a respective electrically conductive layer; and
a respective spacer dielectric portion, wherein the respective electrically conductive layer and spacer dielectric portion are laterally adjoined to each other, and wherein each vertically neighboring pair of the spacer dielectric portions is vertically spaced apart from each other by a thickness of an intervening one of the insulating layers;
memory stack structures vertically extending through the alternating stack and each of the memory stack structures comprising:
a respective memory film; and
a respective vertical semiconductor layer that is laterally surrounded by the respective memory film; and
at least one through-memory-level via structure that vertically extends through each of the spacer dielectric portions and the insulating layers, wherein the at least one through-memory-level via structure extends below bottommost surfaces of the memory stack structures.

2. The semiconductor structure of claim 1, wherein:
each of the memory stack structures passes through the electrically conductive layers, and does not pass through any of the spacer dielectric portions; and
the at least one through-memory-level via structure vertically extends at least from a first horizontal plane including a topmost surface of the memory-level assembly to a second horizontal plane including a bottommost surface of the memory-level assembly.

3. The semiconductor structure of claim 1, wherein the at least one through-memory-level via structure extends through, and is laterally surrounded by, each of the spacer dielectric portions within the alternating stack.

4. The semiconductor structure of claim 3, wherein:
each of the spacer dielectric portions directly contacts each of the at least one through-memory-level via structure; and
each of the at least one through-memory level via structure is laterally spaced from the electrically conductive layers by the spacer dielectric portions,
wherein the at least one through-memory level via structure consists of at least one conductive material and is free of any dielectric material therein.

5. The semiconductor structure of claim 1, wherein the memory stack structures are laterally spaced from the at least one through-memory-level via structure by a support pillar region that laterally surrounds the spacer dielectric portions and including a plurality of support pillar structures.

6. The semiconductor structure of claim 5, wherein:
each of the support pillar structures and each of the memory stack structures comprise a set of the same material layers including a respective memory film and a respective vertical semiconductor layer;
at least one topmost electrically conductive layer comprises a drain select gate electrode;
at least one bottommost electrically conductive layer comprises a source select gate electrode; and
the electrically conductive layers located between the at least one top most electrically conductive layer and the at least one bottommost electrically conductive layer comprise control gate electrodes for a three-dimensional NAND memory device.

7. The semiconductor structure of claim 5, wherein the plurality of support pillar structures comprises a first subset of support pillar structures that directly contact the electrically conductive layers and the spacer dielectric portions.

8. The semiconductor structure of claim 7, wherein the plurality of support pillar structures comprises a second subset of support pillar structures that directly contact the electrically conductive layers and does not directly contact, and is laterally spaced from, the spacer dielectric portions.

9. The semiconductor structure of claim 8, wherein the plurality of support pillar structures comprises a third subset of support pillar structures that directly contact the spacer dielectric portions and does not directly contact, and is laterally spaced from, the electrically conductive layers.

10. The semiconductor structure of claim 1, further comprising a plurality of laterally-elongated contact via structures that vertically extend through the memory-level assembly and laterally extend along a first horizontal direction, wherein the spacer dielectric portions are located between a pair of laterally-elongated contact via structures that are spaced apart along the first horizontal direction.

11. The semiconductor structure of claim 1, wherein:
each of the spacer dielectric portions within the alternating stack has a respective pair of concave sidewalls and a respective pair of substantially parallel straight sidewalls;
each pair of concave sidewalls faces a first horizontal direction and are laterally spaced apart along the first horizontal direction; and
each pair of substantially parallel straight sidewalls is parallel to the first horizontal direction.

12. The semiconductor structure of claim 11, further comprising a pair of contact trenches including a pair of laterally-elongated contact via structures, wherein the pair of contact trenches vertically extend through the memory-level assembly, laterally extend along the first horizontal direction, laterally spaced apart along the first horizontal direction, and are substantially co-linear with each other along the first horizontal direction, wherein the spacer dielectric portions are located between the pair of contact trenches.

13. The semiconductor structure of claim 11, wherein a plurality of spacer dielectric portions among the spacer dielectric portions of the alternating stack is laterally surrounded by, and is located within a hole through, a respective one of the electrically conductive layers within the alternating stack.

14. The semiconductor structure of claim 12, wherein:
each pair of concave sidewalls are substantially equidistant from a most proximal sidewall of the pair of contact trenches.

15. The semiconductor structure of claim 1, wherein:
semiconductor devices of a driver circuit for the memory level assembly is located below a horizontal plane including a bottom most surface of the memory level assembly;
a lower level metal interconnect structure electrically contacts, and overlies, at least one node of the semiconductor devices and underlies the memory level assembly; and
the at least one through-memory-level via structure contacts a top surface of the lower level metal interconnect structure and a bottom surface of an upper level metal interconnect structure overlying a horizontal plane including a topmost surface of the memory-level assembly.

16. The semiconductor structure of claim 1, wherein:
two or more topmost layers among the electrically conductive layers comprise drain select gate electrodes;
each of the drain select gate electrodes is physically divided into multiple portions by a dielectric material portion around the at least one through-memory-level via structure; and
a stepped region is provided in which a first drain select electrode extends closer to the at least one through-memory-level via structure than a second drain select electrode located above the first drain select electrode is to the at least one through-memory-level via structure.

17. The semiconductor structure of claim 1, wherein:
the memory stack structures comprise memory elements of a vertical NAND device;
the electrically conductive layers comprise, or are electrically connected to, a respective word line of the vertical NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising at least one of a word line driver circuit and a bit line driver circuit for the vertical NAND device; and
the array of monolithic three-dimensional NAND strings comprises:
a plurality of semiconductor channels, wherein at least one end portion of each of the plurality of semiconductor channels extends substantially perpendicular to a top surface of the semiconductor substrate;

a plurality of charge storage elements, each charge storage element located adjacent to a respective one of the plurality of semiconductor channels; and a plurality of control gate electrodes having a strip shape extending substantially parallel to the top surface of the semiconductor substrate, the plurality of control gate electrodes comprise at least a first control gate electrode located in the first device level and a second control gate electrode located in the second device level.

18. The semiconductor structure of claim 1, further comprising:

at least one lower level metal structure located between the substrate and the memory level assembly and directly contacting a bottom surface of a respective one of the at least one through-memory-level via structure; and a planar semiconductor layer comprising a horizontal channel and located above a horizontal plane including a topmost surface of the at least one lower level metal structure, wherein a bottommost surface of each of the memory stack structures contacts a respective surface of the planar semiconductor layer, and a bottom end of each of the vertical semiconductor layer adjoins the horizontal channel, wherein the at least one through-memory-level via structure extends below a horizontal plane including a bottom surface of the planar semiconductor material layer.

19. The semiconductor structure of claim 18, further comprising at least one lower level dielectric layer located between the substrate and the planar semiconductor layer, wherein the at least one lower level metal structure is embedded within the at least one lower level dielectric layer, wherein a surface of the planar semiconductor layer contacts a surface of the at least one lower level dielectric layer.

20. The semiconductor structure of claim 1, wherein:

the at least one through-memory-level via structure comprises a plurality of through-memory-level via structures; and each of the plurality of through-memory-level via structures directly contacts each of the spacer dielectric portions and is laterally spaced from the electrically conductive layers by the spacer dielectric portions.

21. The semiconductor structure of claim 1, wherein the at least one through-memory-level via structure continuously extends vertically above topmost surfaces of the memory stack structures, through an entire height range of the memory stack structures, and below the bottommost surfaces of the memory stack structures.

22. The semiconductor structure of claim 1, wherein:

the spacer dielectric portions of the alternating stack comprise a plurality of spacer dielectric portions as a subset;

each of the plurality of spacer dielectric portions has a respective maximum vertical extent between a respective top surface thereof and a respective bottom surface thereof; and each maximum vertical extent is the same as a vertical separation distance between a respective vertically neighboring pair of the insulating layers within the alternating stack.

23. The semiconductor structure of claim 1, wherein:

the spacer dielectric portions are vertically spaced from each other by the insulating layers;

each of the spacer dielectric portions overlies or underlies one another with an areal overlap thereamongst in a plan view along a direction perpendicular to a top surface of the substrate; and a total number of the spacer dielectric portions is the same as a total number of the insulating layers within the alternating stack.

24. The semiconductor structure of claim 1, wherein the spacer dielectric portions of the alternating stack comprise a plurality of the spacer dielectric portions as a subset, wherein each of the plurality of the spacer dielectric portions directly contacts a bottom surface of an overlying one of the insulating layers of the alternating stack and directly contacts a top surface of an underlying one of the insulating layers of the alternating stack.

25. The semiconductor structure of claim 1, wherein:

the insulating layers comprise silicon oxide; and the spacer dielectric portions consist essentially of silicon nitride.

26. The semiconductor structure of claim 1, wherein:

each of the spacer dielectric portions has a respective vertical extent that does not exceed a vertical extent of a respective electrically conductive layer contained within a same composite layer; and the spacer dielectric portions are located within a through-memory-stack via region, overlies or underlies one another with areal overlaps in a plan view.

27. The semiconductor structure of claim 1, wherein each of the spacer dielectric portions has a respective vertical extent that is the same as a vertical spacing between a respective vertically neighboring pair of insulating layers among the insulating layers of the alternating stack.

* * * * *